United States Patent
Tezuka et al.

(10) Patent No.: US 8,410,486 B2
(45) Date of Patent: Apr. 2, 2013

(54) METHOD FOR MANUFACTURING MICROCRYSTALLINE SEMICONDUCTOR FILM AND METHOD FOR MANUFACTURING SEMICONDUCTOR DEVICE

(75) Inventors: Sachiaki Tezuka, Atsugi (JP); Yasuhiro Jinbo, Atsugi (JP); Toshinari Sasaki, Atsugi (JP); Hidekazu Miyairi, Atsugi (JP)

(73) Assignee: Semiconductor Energy Labortory Co., Ltd., Atsugi-shi, Kanagawa-ken (JP)

( * ) Notice: Subject to any disclaimer, the term of this patent is extended or adjusted under 35 U.S.C. 154(b) by 125 days.

(21) Appl. No.: 13/102,386

(22) Filed: May 6, 2011

(65) Prior Publication Data
US 2011/0278582 A1 Nov. 17, 2011

(30) Foreign Application Priority Data
May 14, 2010 (JP) ................... 2010-112281

(51) Int. Cl.
*H01L 29/10* (2006.01)
(52) U.S. Cl. ............ 257/66; 257/43; 257/53; 257/57; 257/59; 257/72; 438/104; 438/157; 438/158
(58) Field of Classification Search .............. None
See application file for complete search history.

(56) References Cited

U.S. PATENT DOCUMENTS

| | | |
|---|---|---|
| 4,409,134 A | 10/1983 | Yamazaki |
| 5,453,858 A | 9/1995 | Yamazaki |
| 5,514,879 A | 5/1996 | Yamazaki |
| 5,571,578 A | 11/1996 | Kaji et al. |
| 5,582,880 A | 12/1996 | Mochizuki et al. |
| 5,591,987 A | 1/1997 | Yamazaki et al. |
| 5,614,732 A | 3/1997 | Yamazaki |
| 5,648,293 A | 7/1997 | Hayama et al. |
| 5,677,236 A | 10/1997 | Saitoh et al. |

(Continued)

FOREIGN PATENT DOCUMENTS

| | | |
|---|---|---|
| EP | 0535979 A2 | 4/1993 |
| JP | 04-242724 A | 8/1992 |

(Continued)

OTHER PUBLICATIONS

Lee.C et al., "Postdeposition Thermal Annealing and Material Stability of 75° C. Hydrogenated Nanocrystalline Silicon Plasma-Enhanced Chemical Vapor Deposition Films ,", J. Appl. Phys.(Journal of Applied Physics), Aug. 4, 2005, vol. 98, pp. 034305-1-034305-7.

(Continued)

*Primary Examiner* — Kyoung Lee
(74) *Attorney, Agent, or Firm* — Eric J. Robinson; Robinson Intellectual Property Law Office, P.C.

(57) ABSTRACT

A method for manufacturing a semiconductor device having favorable electric characteristics with high productivity is provided. A first microcrystalline semiconductor film is formed over an oxide insulating film under a first condition that mixed phase grains with high crystallinity are formed at a low particle density. After that, a second microcrystalline semiconductor film is stacked over the first microcrystalline semiconductor film under a second condition that a space between the mixed phase grains are filled by the crystal growth of the mixed phase grains of the first microcrystalline semiconductor film.

25 Claims, 17 Drawing Sheets

U.S. PATENT DOCUMENTS

| | | | |
|---|---|---|---|
| 5,701,167 A | 12/1997 | Yamazaki | |
| 5,849,601 A | 12/1998 | Yamazaki | |
| 5,859,445 A | 1/1999 | Yamazaki | |
| 6,011,277 A | 1/2000 | Yamazaki | |
| 6,023,075 A | 2/2000 | Yamazaki | |
| 6,153,893 A | 11/2000 | Inoue | |
| 6,252,249 B1 | 6/2001 | Yamazaki | |
| 6,265,288 B1 | 7/2001 | Okamoto et al. | |
| 6,271,055 B1 | 8/2001 | Yajima et al. | |
| 6,281,520 B1 | 8/2001 | Yamazaki | |
| 6,306,213 B1 | 10/2001 | Yamazaki | |
| 6,344,420 B1 | 2/2002 | Miyajima et al. | |
| 6,468,839 B2 | 10/2002 | Inoue | |
| 6,737,676 B2 | 5/2004 | Yamazaki | |
| 6,855,621 B2 | 2/2005 | Kondo et al. | |
| 7,067,844 B2 | 6/2006 | Yamazaki | |
| 7,098,479 B1 | 8/2006 | Yamazaki | |
| 7,115,902 B1 | 10/2006 | Yamazaki | |
| 7,551,655 B2 | 6/2009 | Tanaka et al. | |
| 7,576,360 B2 | 8/2009 | Yamazaki | |
| 7,833,845 B2 | 11/2010 | Yamazaki et al. | |
| 2009/0002591 A1 | 1/2009 | Yamazaki et al. | |
| 2009/0033818 A1 | 2/2009 | Nakajima et al. | |
| 2009/0047759 A1* | 2/2009 | Yamazaki et al. | 438/158 |
| 2009/0057683 A1 | 3/2009 | Nakajima et al. | |
| 2009/0061574 A1 | 3/2009 | Nakajima et al. | |
| 2009/0072237 A1 | 3/2009 | Yamazaki et al. | |
| 2010/0216285 A1 | 8/2010 | Yokoi et al. | |
| 2011/0039402 A1 | 2/2011 | Yamazaki et al. | |
| 2011/0059562 A1 | 3/2011 | Yamazaki et al. | |
| 2011/0318888 A1 | 12/2011 | Komatsu et al. | |
| 2012/0021570 A1 | 1/2012 | Tajima et al. | |
| 2012/0052637 A1 | 3/2012 | Komatsu et al. | |
| 2012/0100675 A1 | 4/2012 | Komatsu et al. | |
| 2012/0115285 A1 | 5/2012 | Komatsu et al. | |

FOREIGN PATENT DOCUMENTS

| | | |
|---|---|---|
| JP | 05-129608 A | 5/1993 |
| JP | 05-275346 | 10/1993 |
| JP | 06-077483 A | 3/1994 |
| JP | 07-045833 A | 2/1995 |
| JP | 07-131030 A | 5/1995 |
| JP | 07-162003 A | 6/1995 |
| JP | 07-211708 A | 8/1995 |
| JP | 09-232235 A | 9/1997 |
| JP | 2000-174310 A | 6/2000 |
| JP | 2000-269201 A | 9/2000 |
| JP | 2000-277439 A | 10/2000 |
| JP | 2001-053283 A | 2/2001 |
| JP | 3201492 | 8/2001 |
| JP | 2002-206168 A | 7/2002 |
| JP | 2002-246605 A | 8/2002 |
| JP | 2002-280309 A | 9/2002 |
| JP | 2003-037278 A | 2/2003 |
| JP | 2004-200345 A | 7/2004 |
| JP | 2005-049832 A | 2/2005 |
| JP | 2005-167264 A | 6/2005 |
| JP | 2005-191546 A | 7/2005 |
| JP | 2006-237490 A | 9/2006 |
| JP | 2009-044134 A | 2/2009 |
| JP | 2009-076753 A | 4/2009 |
| JP | 2009-088501 A | 4/2009 |
| WO | WO-2011/142443 | 11/2011 |

OTHER PUBLICATIONS

Lee.C et al., "Directly Deposited Nanocrystalline Silicon Thin-Film Transistors With Ultra High Mobilities,", Appl. Phys. Lett. (Applied Physics Letters), Dec. 18, 2006, vol. 89, No. 25, pp. 252101-1-252101-3.

Lee.C et al., "High-Mobility Nanocrystalline Silicon Thin-Film Transistors Fabricated by Plasma-Enhanced Chemical Vapor Deposition,", Appl. Phys. Lett. (Applied Physics Letters), May 24, 2005, vol. 86, pp. 222106-1-222106-3.

Lee.C et al., "High-Mobility N-Channel and P-Channel Nanocrystalline Silicon Thin-Film Transistors,", IEDM 05: Technical Digest of International Electron Devices Meeting, 2005, pp. 937-940.

Lee.C et al., "How to Achieve High Mobility Thin Film Transistors by Direct Deposition of Silicon Using 13.56 MHZ RF PECVD?,", IEDM, 2006, pp. 295-298.

Esmaeili-Rad.M et al., "High Stability, Low Leakage Nanocrystalline Silicon Bottom Gate Thin Film Transistors for AMOLED Displays,", IEEE IEDM, 2006, pp. 303-306.

Lee.H et al., "Leakage Current Mechanisms in Top-Gate Nanocrystalline Silicon Thin-Film Transistors,", Appl. Phys. Lett. (Applied Physics Letters), Feb. 28, 2008, vol. 92, pp. 083509-1-083509-3.

Esmaeili-Rad.M et al., "Absence of Defect State Creation in Nanocrystalline Silicon Thin-Film Transistors Deduced From Constant Current Stress Measurements,", Appl. Phys. Lett. (Applied Physics Letters), Sep. 12, 2007, vol. 91, pp. 113511-1-113511-3.

Lee.C et al., "Stability of NC-SI:H TFTs With Silicon Nitride Gate Dielectric,", IEEE Transactions on Electron Devices, 2007, vol. 54, No. 1, pp. 45-51.

Sazonov.A et al., "Low-Temperature Materials and Thin Film Transistors for Flexible Electronics,", Proceedings of the IEEE, Aug. 1, 2005, vol. 93, No. 8, pp. 1420-1428.

Arai.T et al., "41.2: Micro Silicon Technology for Active Matrix OLED Display,", SID Digest '07 : SID International Symposium Digest of Technical Papers, 2007, vol. 38, pp. 1370-1373.

\* cited by examiner

200nm

200nm

150nm

150nm

200nm

200nm

METHOD FOR MANUFACTURING MICROCRYSTALLINE SEMICONDUCTOR FILM AND METHOD FOR MANUFACTURING SEMICONDUCTOR DEVICE

BACKGROUND OF THE INVENTION

1. Field of the Invention

The present invention relates to a method for manufacturing a microcrystalline semiconductor film, a method for manufacturing a semiconductor device which uses the microcrystalline semiconductor film, and a display device.

In this specification, a semiconductor device means all types of devices which can function by utilizing semiconductor characteristics, and a display device, an electro-optical device, a photoelectric conversion device, a semiconductor circuit, and an electronic appliance are all semiconductor devices.

2. Description of the Related Art

As one type of a field-effect transistor, a thin film transistor whose channel region is formed using a semiconductor film which is formed over a substrate having an insulating surface is known. Techniques in which amorphous silicon, microcrystalline silicon, or polycrystalline silicon is used for the semiconductor film which is used for the channel region of the thin film transistor have been disclosed (see Patent Documents 1 to 5). A typical application of the thin film transistors is a liquid crystal display television device, in which thin film transistors are practically used as a switching transistor for each pixel that constitutes a display screen.

A photoelectric conversion device is being developed in which microcrystalline silicon, which is crystalline silicon capable of being manufactured by a plasma CVD method, is used in a semiconductor film for photoelectric conversion (for example, see Patent Document 6).

REFERENCE

[Patent Document 1] Japanese Published Patent Application No. 2001-053283
[Patent Document 2] Japanese Published Patent Application No. H5-129608
[Patent Document 3] Japanese Published Patent Application No. 2005-049832
[Patent Document 4] Japanese Published Patent Application No. H7-131030
[Patent Document 5] Japanese Published Patent Application No. 2005-191546
[Patent Document 6] Japanese Published Patent Application No. 2000-277439

SUMMARY OF THE INVENTION

A thin film transistor in which a channel region is formed using an amorphous silicon film has problems of low field-effect mobility and low on-state current. On the other hand, a thin film transistor in which a channel region is formed using a microcrystalline silicon film has a problem in that, although the field-effect mobility is improved, the off-state current is higher than that of the thin film transistor whose channel region is formed using an amorphous silicon film and thus sufficient switching characteristics cannot be obtained.

A thin film transistor whose channel region is formed using a polycrystalline silicon film features in that the field-effect mobility is far higher than those of the above-described two kinds of thin film transistors and the on-state current is high. Because of such characteristics, this thin film transistor can be used not only as a switching transistor provided in a pixel but also in a driver circuit for which high-speed operation is required.

However, formation of the thin film transistor whose channel region is formed using a polycrystalline silicon film involves a crystallization step of a semiconductor film and has a problem of higher manufacturing costs, as compared to formation of the thin film transistor whose channel region is formed using an amorphous silicon film. For example, the laser annealing technique involved in the process for manufacturing a polycrystalline silicon film has a problem in that the irradiated area with a laser beam is small and large-screen liquid crystal panels cannot be produced efficiently.

A glass substrate for manufacturing display panels has grown in size in the following order: the 3rd generation (550 mm×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). The increase in size of glass substrates is based on the concept of minimum cost design.

On the other hand, a technique with which a thin film transistor capable of high-speed operation can be manufactured with high productivity over a large-area mother glass substrate like the 10th generation (2950 mm×3400 mm) has not been established yet, which is a problem in industry.

An object of one embodiment of the present invention is to provide a method for manufacturing a semiconductor device having excellent electric characteristics with high productivity.

According to one embodiment of the present invention, a first microcrystalline semiconductor film is formed over an oxide insulating film under a first condition so that mixed phase grains with high crystallinity are formed at a low particle density, and then, a second microcrystalline semiconductor film is formed over the first microcrystalline semiconductor film under a second condition so that a space between the mixed phase grains is filled by the crystal growth of the mixed phase grains.

The first condition under which the mixed phase grains with high crystallinity are formed at a high particle density is a condition that a deposition gas containing silicon or germanium is diluted with hydrogen whose flow rate is greater than or equal to 50 times and less than or equal to 1000 times that of the deposition gas, and the pressure inside a process chamber is greater than or equal to 67 Pa and less than or equal to 1333 Pa. The second condition under which a space between the mixed phase grains of the first microcrystalline semiconductor film is filled by the crystal growth of the mixed phase grains is a condition that a deposition gas containing silicon or germanium is diluted with hydrogen whose flow rate is greater than or equal to 100 times and less than or equal to 2000 times that of the deposition gas, and the pressure inside a process chamber is greater than or equal to 1333 Pa and less than or equal to 13332 Pa.

One embodiment of the present invention is a manufacturing method in which a first microcrystalline semiconductor film having a mixed phase grains including a semiconductor crystallite and an amorphous semiconductor is formed under a first condition over an oxide insulating film by a plasma CVD method; and a second microcrystalline semiconductor film is formed under a second condition over the first microcrystalline semiconductor film by a plasma CVD method.

The first condition is a condition under which a gas including a deposition gas containing silicon or germanium and hydrogen is used as a source gas supplied to a process chamber; the deposition gas is diluted with hydrogen whose flow rate is greater than or equal to 50 times and less than or equal to 1000 times that of the deposition gas; and the pressure inside the process chamber is greater than or equal to 67 Pa and less than or equal to 1333 Pa. The second condition is a condition under which a gas including a deposition gas containing silicon or germanium and hydrogen is used as a source gas supplied to a process chamber; the deposition gas is diluted with hydrogen whose flow rate is greater than or equal to 100 times and less than or equal to 2000 times that of the deposition gas; and the pressure inside the process chamber is greater than or equal to 1333 Pa and less than or equal to 13332 Pa.

Note that the power of the plasma is preferably selected as appropriate in accordance with the ratio of the flow rate of hydrogen to the flow rate of the deposition gas containing silicon or germanium.

According to one embodiment of the present invention, after the second microcrystalline semiconductor film is formed under the second condition, a third microcrystalline semiconductor film is formed under a third condition over the second microcrystalline semiconductor film by a plasma CVD method. The third condition may be a condition under which a gas including a deposition gas containing silicon or germanium and hydrogen is used as a source gas supplied to a process chamber; the deposition gas is diluted with hydrogen with the flow ratio of hydrogen to the deposition gas higher than that of the second condition; and the pressure inside the process chamber is greater than or equal to 1333 Pa and less than or equal to 13332 Pa.

According to one embodiment of the present invention, the first condition is preferably a condition under which a mixed phase grain which becomes a nucleus is formed and the particle density of the mixed phase grains is low, and the second condition is preferably a condition under which the density of the second microcrystalline semiconductor film is large.

According to one embodiment of the present invention, a rare gas can be added to the source gas used in at least one of the above first condition, the second condition, and the third condition.

According to one embodiment of the present invention, a first microcrystalline silicon film having a plurality of mixed phase grains which becomes a nucleus is formed at a low particle density under a first condition by a plasma CVD method. A second microcrystalline semiconductor film whose density is higher than the first microcrystalline semiconductor film is formed by a plasma CVD method over the first microcrystalline silicon film under a second condition in which the mixed phase grains are subjected to crystal growth to fill a space between the mixed phase grains of the first microcrystalline semiconductor film. The mixed phase grain includes a semiconductor crystallite and an amorphous semiconductor.

Further, one embodiment of the present invention is a method for manufacturing a semiconductor device including a thin film transistor whose channel region is formed using the stacked first and second microcrystalline semiconductor films.

One embodiment of the present invention is a method for manufacturing a photoelectric conversion device in which the stacked first and second microcrystalline semiconductor films is used as at least one of a semiconductor film having a p-type conductivity, a semiconductor film having an n-type conductivity, and a semiconductor film for photoelectric conversion.

According to one embodiment of the present invention, a microcrystalline silicon film having higher crystallinity can be manufactured. Moreover, a semiconductor device which has excellent electric characteristics can be manufactured with high productivity.

DETAILED DESCRIPTION OF THE INVENTION

Figure 1A:
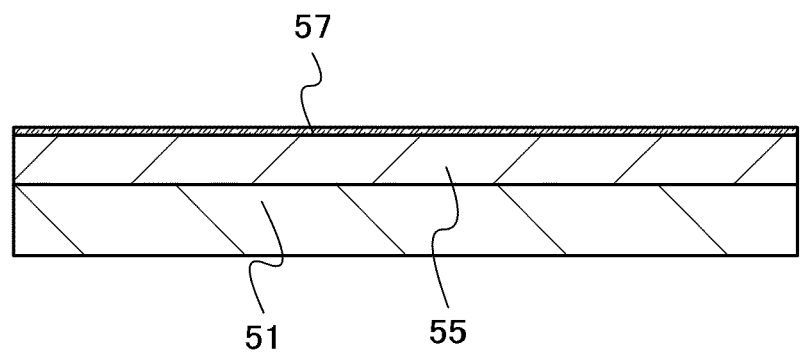
FIGS. 1A and 1B are cross-sectional views illustrating a method for manufacturing a microcrystalline semiconductor film according to one embodiment of the present invention.

Hereinafter, embodiments of the present invention are described with reference to the drawings. However, the present invention is not limited to the following description. It is easily understood by those skilled in the art that the mode and detail can be variously changed unless departing from the scope and spirit of the present invention. Therefore, the present invention is not construed as being limited to the following description of the embodiments and examples.

Note that reference numerals denoting the same portions are commonly used in different drawings.

EMBODIMENT 1

In this embodiment, a method for manufacturing a microcrystalline semiconductor film having high crystallinity is described with reference to FIGS. 1A and 1B and FIGS. 2A and 2B.

As illustrated in FIG. 1A, an oxide insulating film 55 is formed over a substrate 51, and a first microcrystalline semiconductor film 57 is formed over the oxide insulating film 55.

As the substrate 51, a glass substrate; a ceramic substrate; a plastic substrate which has high heat resistance enough to withstand a process temperature of this manufacturing process; or the like can be used. In the case where the substrate does not need a light-transmitting property, a metal substrate, such as a stainless steel substrate, provided with an insulating film on its surface may be used. As a glass substrate, for example, an alkali-free glass substrate including barium borosilicate glass, aluminoborosilicate glass, aluminosilicate glass, or the like is preferably used. There is no limitation on the size of the substrate 51; for example, any of the 3rd to 10th generation glass substrates, which are often used in the field of the above-described flat panel display, can be used.

The oxide insulating film 55 can be formed as a single layer or a stacked layer including a silicon oxide film, a silicon oxynitride film, an aluminum oxide film, and/or an aluminum nitride oxide film by a CVD method, a sputtering method, or the like.

The silicon oxynitride means silicon that contains more oxygen than nitrogen, and preferably contains, when measured using Rutherford backscattering spectrometry (RBS) and hydrogen forward scattering spectrometry (HFS), oxygen, nitrogen, silicon, and hydrogen at concentrations ranging from 50 at. % to 70 at. %, 0.5 at. % to 15 at. %, 25 at. % to 35 at., % and 0.1 at. % to 10 at. %, respectively. Although not described here, "silicon nitride oxide" here refers to silicon that contains more nitrogen than oxygen and, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively, according to the measurement using RBS and HFS. Note that percentages of nitrogen, oxygen, silicon, and hydrogen fall within the ranges given above, where the total number of atoms contained in the silicon oxynitride or the silicon nitride oxide is defined as 100 at. %.

The first microcrystalline semiconductor film 57 is formed using a microcrystalline semiconductor film, typically a microcrystalline silicon film, a microcrystalline silicon-germanium film, a microcrystalline germanium film, or the like. The first microcrystalline semiconductor film 57 has mixed phase grains with high crystallinity at a low particle density (in-plane existence ratio of the mixed phase grain). Therefore, in the first microcrystalline semiconductor film 57, in some cases, the mixed phase grains are not in contact with each other and have a space therebetween. The thickness of the first microcrystalline semiconductor film 57 is preferably greater than or equal to 1 nm and less than or equal to 10 nm. The mixed phase grain includes an amorphous semiconductor region and a plurality of crystallites which are minute crystals each of which can be regarded as a single crystal.

The first microcrystalline semiconductor film 57 is formed in a process chamber of a plasma CVD apparatus by glow discharge plasma with the use of a mixture of a deposition gas containing silicon or germanium and hydrogen by forming a mixed phase grain with high crystallinity, which becomes a nucleus, at a low particle density over the substrate under a first condition. Alternatively, the first microcrystalline semiconductor film 57 is formed by glow discharge plasma with a mixture of a deposition gas including silicon or germanium, hydrogen, and a rare gas such as helium, neon, or krypton. In this embodiment, microcrystalline silicon, microcrystalline silicon-germanium, microcrystalline germanium, or the like is formed under a first condition that the deposition gas containing silicon or germanium is diluted with hydrogen whose flow rate is greater than or equal to 50 times and less than or equal to 1000 times that of the deposition gas, and the pressure inside the process chamber is greater than or equal to 67 Pa and less than or equal to 1333 Pa (greater than or equal to 0.5 Torr and less than or equal to 10 Torr). The deposition temperature in that case is preferably room temperature to 300° C., further preferably 150° C. to 280° C. Note that a gap between an upper electrode and a lower electrode may be set to allow generation of plasma. By using the first condition, crystal growth is promoted and crystallinity of the mixed phase grain is improved. That is, the size of a crystallite included in the mixed phase grain is increased. Further, the mixed phase grains adjacent to each other are spaced from each other, so that the particle density of the mixed phase grains is reduced.

As typical examples of the deposition gas containing silicon or germanium, $SiH_4$, $Si_2H_6$, $GeH_4$, and $Ge_2H_6$ are given.

The rare gas such as helium, neon, argon, krypton, or xenon may be added to the source gas for the first microcrystalline semiconductor film 57, so that the deposition rate of the first microcrystalline semiconductor film 57 is increased. When the deposition rate is increased, the amount of impurities included into the first microcrystalline semiconductor film 57 can be reduced, whereby crystallinity of the first microcrystalline semiconductor film 57 can be improved.

When the first microcrystalline semiconductor film 57 is formed, glow discharge plasma is generated by applying high-frequency power with a frequency of 3 MHz to 30 MHz, typically, 13.56 MHz or 27.12 MHz in the HF band, or high-frequency power with a frequency of approximately 30 MHz to 300 MHz in the VHF band, typically 60 MHz. Alternatively, glow discharge plasma is generated by applying high frequency power at a microwave frequency of 1 GHz or more. Note that a pulsed oscillation by which high-frequency power is applied in a pulsed manner or a continuous oscillation by which high-frequency power is applied continuously may be applied. In addition, by superimposing high-frequency power in the HF band and high-frequency power in the VHF band on each other, unevenness of plasma in a large-sized substrate is also reduced, so that uniformity can be improved and the deposition rate can be increased.

Note that before the first microcrystalline semiconductor film 57 is formed, a deposition gas containing silicon or germanium is introduced into the process chamber while a gas in the process chamber of the CVD apparatus is removed so that impurity elements in the process chamber are removed, by which the amount of the impurity elements in the first microcrystalline semiconductor film 57 can be reduced. Further, before the first microcrystalline semiconductor film 57 is formed, plasma may be generated in an atmosphere containing fluorine such as a fluorine atmosphere, a nitrogen fluoride atmosphere, or a silane fluoride atmosphere, and the oxide insulating film 55 may be exposed to the fluorine plasma, so that the first microcrystalline semiconductor film 57 can be formed to be dense.

Figure 1B:
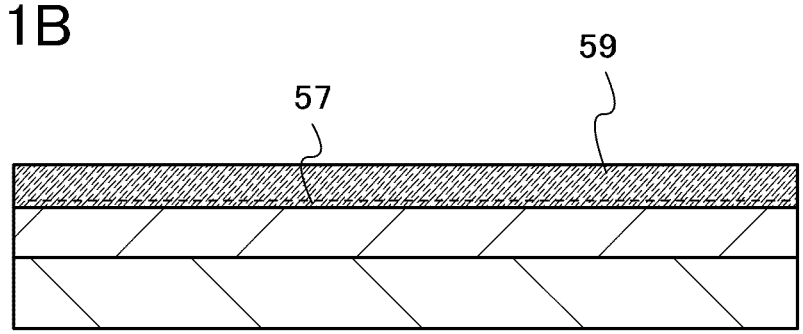

Next, as shown in FIG. 1B, a second microcrystalline semiconductor film 59 is formed over the first microcrystalline semiconductor film 57. The second microcrystalline semiconductor film 59 is formed under a condition that the spaces between the mixed phase grains of the first microcrystalline semiconductor film 57 are filled by the crystal growth of the mixed phase grains. It is preferable that the thickness of the second microcrystalline semiconductor film 59 be greater than or equal to 30 nm and less than or equal to 100 nm.

The second microcrystalline semiconductor film 59 is formed under a second condition by glow discharge plasma with the use of a mixture of hydrogen and a deposition gas containing silicon or germanium in a process chamber of a plasma CVD apparatus. Alternatively, the second microcrystalline semiconductor film 59 is formed under the second condition by glow discharge plasma with the use of a mixture of a source gas and a rare gas such as helium, neon, argon, krypton, or xenon. In this embodiment, microcrystalline silicon, microcrystalline silicon-germanium, microcrystalline germanium, or the like is formed under a second condition that the deposition gas containing silicon or germanium is diluted with hydrogen whose flow rate is greater than or equal to 100 times and less than or equal to 2000 times that of the deposition gas, and the pressure inside the process chamber is greater than or equal to 1333 Pa and less than or equal to 13332 Pa (greater than or equal to 10 Torr and less than or equal to 100 Torr). Thus, in the second microcrystalline semiconductor film 59, the ratio of a crystal region to an amorphous semiconductor is increased to enhance the crystallinity. The deposition temperature in that case is preferably room temperature to 300° C., further preferably 150° C. to 280° C. Note that a gap between an upper electrode and a lower electrode may be a gap which allows generation of plasma.

By using the rare gas such as helium, neon, argon, krypton, or xenon as a diluting gas for the deposition gas, similarly to the first microcrystalline semiconductor film 57, crystallinity of the second microcrystalline semiconductor film 59 can be improved.

The condition of the glow discharge plasma for the formation of the first microcrystalline semiconductor film 57 can be employed to form the second microcrystalline semiconductor film 59, as appropriate. Note that the glow discharge plasma for the formation of the first microcrystalline semiconductor film 57 and that for the formation of the second microcrystalline semiconductor film 59 may be generated under the same condition to improve the throughput or under different conditions.

Formation of the first microcrystalline semiconductor film 57 and the second microcrystalline semiconductor film 59 is described below using FIGS. 2A and 2B.

Figure 2A:
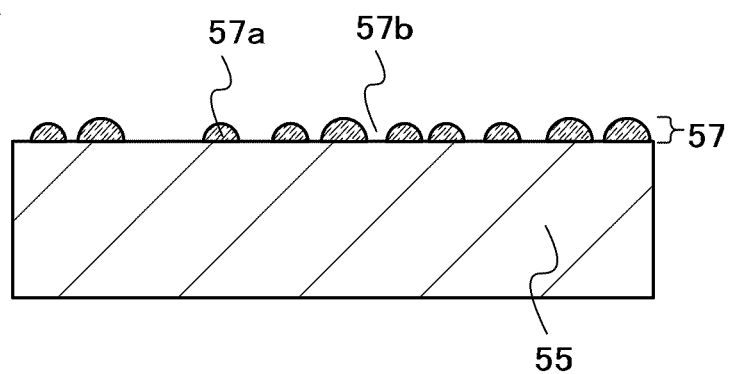
FIGS. 2A and 2B are cross-sectional views illustrating a method for manufacturing a microcrystalline semiconductor film according to one embodiment of the present invention.

FIG. 2A is an enlarged view of the first microcrystalline semiconductor film 57. The first microcrystalline semiconductor film 57 which is formed over the oxide insulating film 55 is formed under the first condition that the particle density of the mixed phase grains is low and crystallinity of the mixed phase grain is high. Typically, the deposition gas containing silicon or germanium is diluted with hydrogen whose flow rate is greater than or equal to 50 times and less than or equal to 1000 times that of the deposition gas, and the pressure inside the process chamber is greater than or equal to 67 Pa and less than or equal to 1333 Pa (greater than or equal to 0.5 Torr and less than or equal to 10 Torr). The flow rate of hydrogen is set to higher than that of the deposition gas containing silicon or germanium as described above, whereby the amorphous semiconductor contained in the first microcrystalline semiconductor film is etched while the deposition of the first microcrystalline semiconductor film, so that the mixed phase grain having high crystallinity is formed and a space is formed between the mixed phase grains adjacent to each other. Optimal conditions differ depending on a plasma CVD apparatus structure and chemical states of a surface of a film; however, when the mixed phase grain is hardly deposited, the aforementioned ratio of the flow rate of hydrogen to that of the deposition gas containing silicon or germanium may be decreased or the RF electric power may be reduced. On the other hand, when the particle density of the mixed phase grains is high or a region of an amorphous semiconductor is larger than a region of a crystalline semiconductor region, the ratio of the flow rate of hydrogen to that of the deposition gas containing silicon or germanium may be increased or the RF electric power may be increased. The state of deposition of the first microcrystalline semiconductor film can be evaluated by SEM (Scanning Electron Microscopy) and Raman spectroscopy. The first microcrystalline semiconductor film which has favorable crystallinity and has a preferable space between the mixed phase grains can be formed depending on the ratio of the flow rate and the pressure of the process chamber as described above. Thus, while the amorphous semiconductor region in the first microcrystalline semiconductor film 57 is etched, mixed phase grains 57a are formed. Accordingly, crystal growth is promoted and crystallinity of the mixed phase grain 57a is improved. That is, the size of a crystallite included in the mixed phase grain 57a is increased. Furthermore, since the amorphous semiconductor region is etched, the mixed phase grains 57a have the space 57b therebetween and are formed at a low particle density.

Figure 2B:
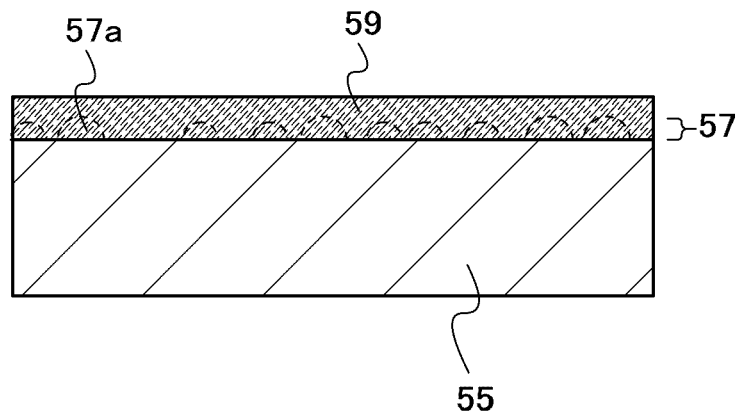

FIG. 2B is an enlarged view of the first microcrystalline semiconductor film 57 and the second microcrystalline semiconductor film 59. The second microcrystalline semiconductor film 59 is formed under the second condition that the spaces between the mixed phase grains of the first microcrystalline semiconductor film 57 are filled by the crystal growth of the mixed phase grains. Typically, the deposition gas containing silicon or germanium is diluted with hydrogen whose flow rate is greater than or equal to 100 times and less than or equal to 2000 times that of the deposition gas, and the pressure inside the process chamber is greater than or equal to 1333 Pa and less than or equal to 13332 Pa (greater than or equal to 10 Torr and less than or equal to 100 Torr). According to the above condition, since the pressure inside the process chamber is high, a mean free path of the deposition gas is short and energy of plasma ions is reduced, so that the coverage of the second microcrystalline semiconductor film 59 is increased and ion damage to the second microcrystalline semiconductor film 59 is reduced to lead to a defect reduction. Further, since the dilution ratio of the deposition gas containing silicon or germanium is high and the amount of the generated hydrogen radicals is increased, the crystal grows using the crystallite included in the mixed phase grain 57a as a seed crystal while the amorphous semiconductor region is etched. Accordingly, in the second microcrystalline semiconductor film 59, the ratio of a crystal region to an amorphous semiconductor region is increased and the crystallinity is enhanced. Further, a defect of the second microcrystalline semiconductor film 59 is reduced. Furthermore, if a mixed phase grain of the second microcrystalline semiconductor film is additionally generated in the space between the mixed phase grains of the first microcrystalline semiconductor film, the size of the mixed phase grains is decreased; therefore, the possibility of generation of the mixed phase grain of the second microcrystalline semiconductor film is preferably fewer as compared to that of the first microcrystalline semiconductor film. In this manner, with the use of the mixed phase grain of the first microcrystalline semiconductor film as a seed crystal, crystal growth from the seed crystal can be prioritized.

At this time, in the second microcrystalline semiconductor film 59, the crystal grows using the crystallite included in the mixed phase grain 57a of the first microcrystalline semiconductor film 57 as a seed crystal. Further, the size of the mixed phase grain of the second microcrystalline semiconductor film 59 depends on the space between the mixed phase grains 57a of the first microcrystalline semiconductor film 57. Therefore, as the particle density of the mixed phase grains 57a of the first microcrystalline semiconductor film 57 is decreased, the space between the mixed phase grains 57a is increased, so that the crystal growth of the mixed phase grain of the second microcrystalline semiconductor film 59 is promoted, resulting in the increase in the size of the mixed phase grain.

The thickness of the first microcrystalline semiconductor film 57 is preferably greater than or equal to 1 nm and less than or equal to 10 nm If the thickness of the first microcrystalline semiconductor film 57 is greater than 10 nm, even when the second microcrystalline semiconductor film 59 is deposited, it is difficult to fill the space between the mixed phase grains and to etch the amorphous semiconductor included in the first microcrystalline semiconductor film 57, so that crystallinity of the first microcrystalline semiconductor film 57 and the second microcrystalline semiconductor film 59 is reduced. In addition, since the mixed phase grain needs to be formed in the first microcrystalline semiconductor film 57, the thickness of the first microcrystalline semiconductor film 57 is preferably greater than or equal to 1 nm.

It is preferable that the thickness of the second microcrystalline semiconductor film 59 be greater than or equal to 30 nm and less than or equal to 100 nm. The thickness of the second microcrystalline semiconductor film 59 which is greater than or equal to 30 nm enables variations of electrical characteristics of a thin film transistor to be suppressed; and the thickness of the second microcrystalline semiconductor film 59 which is less than or equal to 100 nm enables throughput to be increased and film peeling due to stress to be suppressed.

The density of the microcrystalline semiconductor film depends on the particle density of the mixed phase grains of the first microcrystalline semiconductor film 57. Therefore, the particle density of the mixed phase grains of the first microcrystalline semiconductor film 57 is preferably greater than or equal to $100/\mu m^2$ and less than or equal to $10000/\mu m^2$, and still further preferably greater than or equal to $500/\mu m^2$ and less than or equal to $2500/\mu m^2$. When the particle density of the mixed phase grains of the first microcrystalline semiconductor film 57 is within the above range, the mixed phase grains are dispersed, so that the size of the mixed phase grain of the microcrystalline semiconductor film can be increased.

According to this embodiment, the first microcrystalline semiconductor film 57 and the second microcrystalline semiconductor film 59 are stacked, whereby a microcrystalline semiconductor film having high crystallinity with less space between the mixed phase grains can be formed. Note that the density of the microcrystalline semiconductor film is greater than 1.90 g/cm³ and less than or equal to 2.30 g/cm³. The density of single crystal silicon is 2.35 g/cm³; and the mixed phase grains are densely formed in the microcrystalline semiconductor film. The density of the microcrystalline semiconductor film can be measured by an X-ray reflectometer (XRR). The resistivity of the microcrystalline semiconductor film is greater than or equal to $1.0 \times 10^5$ Ω·cm and less than or equal to $1.0 \times 10^8$ Ω·cm, preferably, greater than or equal to $5.0 \times 10^6$ Ω·cm and less than or equal to $5.0 \times 10^7$ Ω·cm. Furthermore, the activation energy of conductivity of the microcrystalline semiconductor film in a state where voltage is not applied is 0.5 eV to 0.6 eV and the microcrystalline semiconductor film is an i-type.

The first microcrystalline semiconductor film 57 and the second microcrystalline semiconductor film 59 are formed using a microcrystalline semiconductor. The microcrystalline semiconductor is a semiconductor having an intermediate structure between an amorphous structure and a crystalline structure (including a single-crystal structure and a polycrystalline structure). A microcrystalline semiconductor is a semiconductor having a third state that is thermodynamically stable and a crystalline semiconductor having short-range order and lattice distortion, in which columnar or needle-like mixed phase grains each having a size of 2 nm to 200 nm, preferably 10 nm to 80 nm, more preferably 20 nm to 50 nm growing in a direction normal to the substrate surface. Therefore, there is a case where a particle boundary is formed at the interface of the columnar or needle-like mixed phase grains. Note that the mixed phase grain size here means a maximum diameter of a mixed phase grain in a plane parallel to the substrate surface.

The Raman spectrum of microcrystalline silicon, which is a typical example of a microcrystalline semiconductor, is located in a lower wavenumber than 520 cm⁻¹, which represents a peak of the Raman spectrum of single crystal silicon. That is, the peak of the Raman spectrum of the microcrystalline silicon exists between 520 cm⁻¹ which represents single crystal silicon and 480 cm⁻¹ which represents amorphous silicon. The microcrystalline semiconductor includes at least 1 at. % or more of hydrogen or halogen to terminate a dangling bond. The microcrystalline semiconductor may further include a rare gas element such as helium, neon, argon, krypton, or xenon to further promote lattice distortion, so that the stability is enhanced and a favorable microcrystalline semiconductor can be obtained. Such a microcrystalline semiconductor is disclosed in, for example, U.S. Pat. No. 4,409,134.

According to this embodiment, the microcrystalline semiconductor film having high crystallinity with the reduced space between the mixed phase grains can be formed.

EMBODIMENT 2

In this embodiment, a method for manufacturing a microcrystalline semiconductor film having higher crystallinity than that of Embodiment 1 is described with reference to FIGS. 1A and 1B and FIG. 3.

Through the steps of FIGS. 1A and 1B, the first microcrystalline semiconductor film 57 and the second microcrystalline semiconductor film 59 are formed in a manner similar to Embodiment 1.

Figure 3:
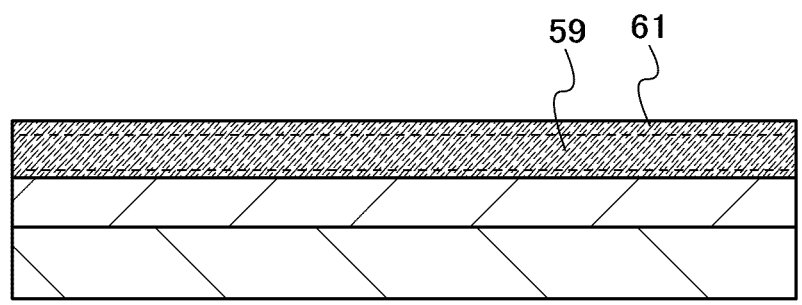
FIG. 3 is a cross-sectional view illustrating a method for manufacturing a microcrystalline semiconductor film according to one embodiment of the present invention.

Next, as illustrated in FIG. 3, a third microcrystalline semiconductor film 61 having a mixed phase grain including a semiconductor crystallite and an amorphous semiconductor is formed over the second microcrystalline semiconductor film 59.

The third microcrystalline semiconductor film 61 is formed under a third condition by glow discharge plasma with the use of a mixture of hydrogen and a deposition gas containing silicon or germanium in a process chamber of a plasma CVD apparatus. Alternatively, the third microcrystalline semiconductor film 61 may be formed under the third condition by glow discharge plasma with the use of a mixture of a deposition gas containing silicon or germanium, hydrogen, and a rare gas such as helium, neon, or krypton. As the third microcrystalline semiconductor film 61, microcrystalline silicon, microcrystalline silicon-germanium, microcrystalline germanium, or the like is formed under the third condition that the deposition gas containing silicon or germanium is diluted with hydrogen whose flow rate is higher than that of the second condition, and the pressure inside the process chamber is greater than or equal to 1333 Pa and less than or equal to 13332 Pa (greater than or equal to 10 Torr and less than or equal to 100 Torr) which is the same as that in the second condition. The deposition temperature in that case is preferably room temperature to 300° C., further preferably 150° C. to 280° C.

The ratio of the flow rate of hydrogen to the flow rate of the deposition gas containing silicon or germanium is higher than that of the second condition, whereby crystallinity of the third microcrystalline semiconductor film 61 can be further improved and a microcrystalline semiconductor film having higher crystallinity in the surface than that of Embodiment 1 can be formed.

EMBODIMENT 3

In this embodiment, a method for manufacturing a thin film transistor formed in the semiconductor device that is one embodiment of the present invention is described with reference to FIGS. 4A to 4D, FIGS. 5A and 5B, FIGS. 6A to 6C, and FIGS. 7A to 7D. Note that an n-channel thin film transistor has higher carrier mobility than a p-channel thin film transistor. Further, it is preferable that all thin film transistors formed over the same substrate have the same polarity because the number of manufacturing steps can be reduced. Therefore, in this embodiment, a method for manufacturing an n-channel thin film transistor is described.

Note that on-state current refers to a current which flows between a source electrode and a drain electrode when a thin film transistor is on. For example, in the case of an n-channel thin film transistor, on-state current refers to a current which flows between a source electrode and a drain electrode when gate voltage is higher than the threshold voltage of the thin film transistor.

In addition, off-state current refers to a current which flows between a source electrode and a drain electrode when a thin film transistor is off. For example, in the case of an n-channel thin film transistor, the off-state current refers to current which flows between a source electrode and a drain electrode when gate voltage is lower than threshold voltage of the thin film transistor.

Figure 4A:
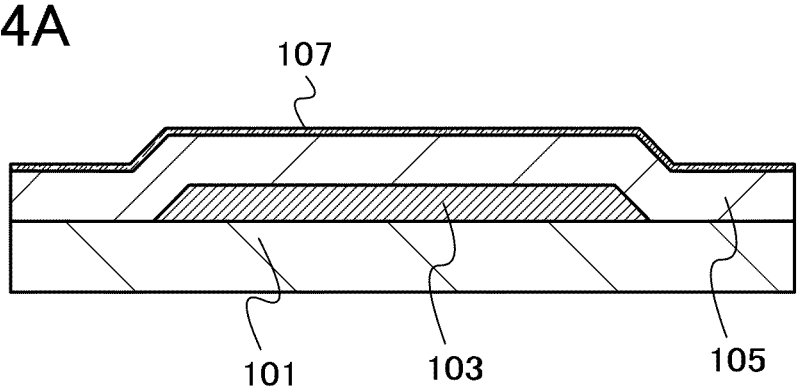
FIGS. 4A to 4D are cross-sectional views illustrating a method for manufacturing a semiconductor device according to one embodiment of the present invention.

As illustrated in FIG. 4A, a gate electrode 103 is formed over a substrate 101. Then, a gate insulating film 105 which covers the gate electrode 103 (also referred to as a first gate electrode) is formed. A first microcrystalline semiconductor film 107 is formed over the gate insulating film 105.

As the substrate 101, the substrate 51 described in Embodiment 1 can be used as appropriate.

The gate electrode 103 can be formed as a single layer or a stacked layer using a metal such as molybdenum, titanium, chromium, tantalum, tungsten, aluminum, copper, neodymium, scandium, or nickel or an alloy which includes any of these materials as a main component. Further, a semiconductor material typified by polycrystalline silicon that is doped with an impurity element such as phosphorus, an AgPdCu alloy, an Al—Nd alloy, an Al—Ni alloy or the like may also be used.

For example, the following structure is preferable as a two-layer structure of the gate electrode 103: a two-layer structure in which a molybdenum film is stacked over an aluminum film; a two-layer structure in which a molybdenum film is stacked over a copper film; a two-layer structure in which a titanium nitride film or a tantalum nitride film is stacked over a copper film; a two-layer structure in which a titanium nitride film and a molybdenum film are stacked; a two-layer structure in which a copper-magnesium alloy film containing oxygen and a copper film are stacked; a two-layer structure in which a copper-manganese alloy film containing oxygen and a copper film are stacked; a two-layer structure in which a copper-manganese alloy film and a copper film are stacked; and the like. As a three-layer structure, it is preferable to stack a tungsten film or a tungsten nitride film, an alloy film of aluminum and silicon or an alloy film of aluminum and titanium, and a titanium nitride film or a titanium film. By stacking a metal film functioning as a barrier film over a film having low electric resistance, electric resistance can be low and diffusion of a metal element from the metal film into the semiconductor film can be prevented.

The gate electrode 103 can be formed in the following manner: a conductive film is formed over the substrate 101 by a sputtering method or a vacuum evaporation method using the above-described material(s); a mask is formed over the conductive film by a photolithography method, an inkjet method, or the like; and the conductive film is etched using the mask. Further, the gate electrode 103 can be formed by discharging a conductive nanopaste of silver, gold, copper, or the like over the substrate by an inkjet method and baking the conductive nanopaste. In order to improve adhesion between the gate electrode 103 and the substrate 101, a film of a nitride of any of the above-described metals may be provided between the substrate 101 and the gate electrode 103. In this embodiment, a conductive film is formed over the substrate 101 and etched using a mask made of a resist formed by a photolithography method.

Note that side surfaces of the gate electrode 103 are preferably tapered. This is because an insulating film, a semiconductor film, and a wiring formed over the gate electrode 103 can be prevented from being disconnected over a step of the gate electrode 103. In order to taper the side surface of the gate electrode 103, etching may be performed while the resist mask is made to recede.

Through the step of forming the gate electrode 103, a gate wiring (a scan line) and a capacitor wiring can also be formed at the same time. Note that a "scanning line" means a wiring which selects a pixel, while a "capacitor wiring" means a wiring which is connected to one of electrodes of a storage capacitor in a pixel. However, without limitation thereto, the gate electrode 103 and either or both a gate wiring and a capacitor wiring may be formed separately.

The gate insulating film 105 can be formed using the oxide insulating film 55 described in Embodiment 1 as appropriate. By forming the gate insulating film 105 using an oxide insulating film such as silicon oxide or silicon oxynitride, fluctuation in threshold voltage of the thin film transistor can be suppressed.

The gate insulating film 105 can be formed by a CVD method, a sputtering method, or the like. The condition used for the deposition of the first microcrystalline semiconductor film 57 which is described in Embodiment 1 can be appropriately employed to generate the glow discharge plasma in the step for the formation of the gate insulating film 105 by a CVD method. When the gate insulating film 105 is formed at a high frequency (1 GHz or more) using a microwave plasma CVD apparatus, the withstand voltage between the gate electrode and the drain and source electrodes can be improved, so that a highly reliable thin film transistor can be obtained.

Further, by forming a silicon oxide film by a CVD method using an organosilane gas as the gate insulating film 105, the crystallinity of the semiconductor film which is formed later can be improved, so that the on-state current and the field-effect mobility of the thin film transistor can be increased. As an organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$) can be used.

Similarly to the first microcrystalline semiconductor film 57 described in Embodiment 1, the first microcrystalline semiconductor film 107 can be formed under a first condition that the particle density of mixed phase grains is low and the crystallinity of the mixed phase grain is high.

A rare gas such as helium, argon, neon, krypton, or xenon may be added to the source gas for the first microcrystalline semiconductor film 107, so that the crystallinity of the first microcrystalline semiconductor film 107 can be increased. Accordingly, the on-state current and the field-effect mobility of the thin film transistor can be increased and throughput of the thin film transistor can also be increased.

Figure 4B:
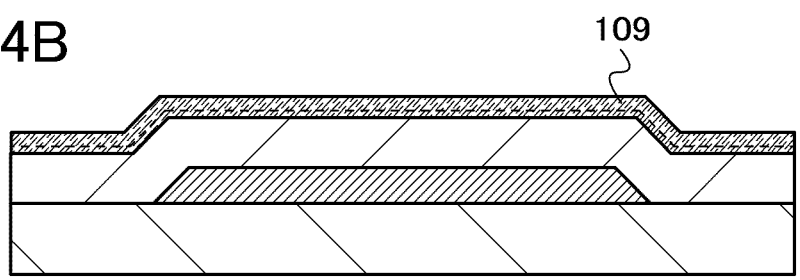

Next, as shown in FIG. 4B, a second microcrystalline semiconductor film 109 is formed over the first microcrystalline semiconductor film 107. Similarly to the second microcrystalline semiconductor film 59 described in Embodiment 1, the second microcrystalline semiconductor film 109 can be formed under a second condition that the spaces between the mixed phase grains of the first microcrystalline semiconductor film 107 are filled by the crystal growth of the mixed phase grains.

A rare gas such as helium, argon, neon, krypton, or xenon may be used as a diluting gas of the deposition gas so that the crystallinity of the second microcrystalline semiconductor film 109 can be increased similarly to the first microcrystalline semiconductor film 107. Accordingly, the on-state current and the field-effect mobility of the thin film transistor can be increased and throughput of the thin film transistor can also be increased.

Figure 4C:
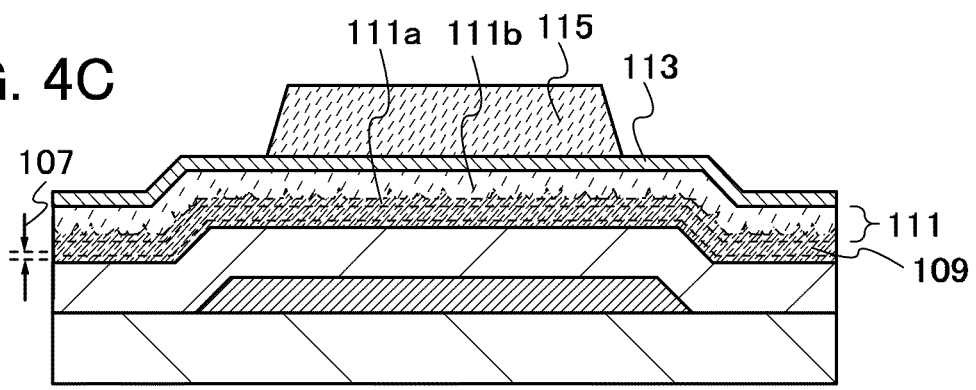
Figure 4D:
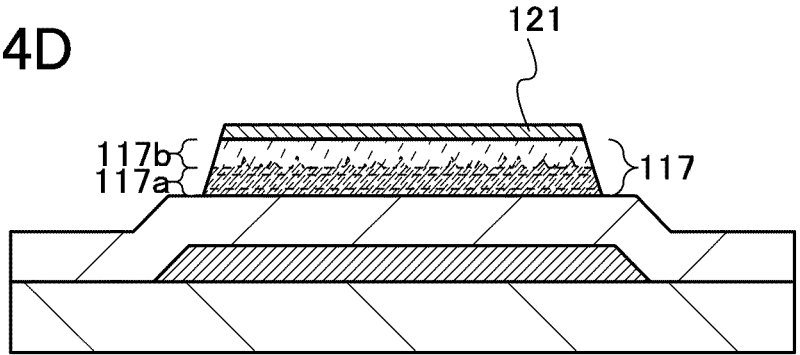

Next, as shown in FIG. 4C, a semiconductor film 111 is formed over the second microcrystalline semiconductor film 109. The semiconductor film 111 includes a microcrystalline semiconductor region 111a and an amorphous semiconductor region 111b. Next, an impurity semiconductor film 113 is formed over the semiconductor film 111. Then, a resist mask 115 is formed over the impurity semiconductor film 113.

The semiconductor film 111 including the microcrystalline semiconductor region 111a and the amorphous semiconductor region 111b can be formed under a condition that crystal growth is partly conducted (the crystal growth is suppressed) with the use of the second microcrystalline semiconductor film 109 as a seed crystal.

The semiconductor film 111 is formed by glow discharge plasma with the use of a mixture of hydrogen, a gas containing nitrogen, and a deposition gas containing silicon or germanium in a process chamber of a plasma CVD apparatus. Examples of the gas containing nitrogen include ammonia, nitrogen, nitrogen fluoride, nitrogen chloride, chloroamine, fluoroamine, and the like. Glow discharge plasma can be generated as in the case of the first microcrystalline semiconductor film 107.

In that case, the flow ratio of the deposition gas containing silicon or germanium to hydrogen is the same as that for forming a microcrystalline semiconductor film like the first microcrystalline semiconductor film 107 or the second microcrystalline semiconductor film 109, and the gas containing nitrogen is added to a source gas, whereby crystal growth can be suppressed as compared to either the deposition condition for the first microcrystalline semiconductor film 107 or that of the second microcrystalline semiconductor film 109. Specifically, at an early stage of deposition of the semiconductor film 111, the gas containing nitrogen included in the source gas partly suppresses the crystal growth, so that a conical microcrystalline semiconductor region or a pyramidal microcrystalline semiconductor region grows and an amorphous semiconductor region is formed. Further, at a middle stage and a later stage of deposition, crystal growth in the conical or pyramidal microcrystalline semiconductor region stops and only the amorphous semiconductor region is formed. Accordingly, in the semiconductor film 111, the microcrystalline semiconductor region 111a and the amorphous semiconductor region 111b which is formed using a well-ordered semiconductor film having fewer defects and a steep tail of a level at a band edge in the valence band can be formed.

In this embodiment, a typical example of the condition for forming the semiconductor film 111 is as follows: the flow rate of hydrogen is 10 to 2000 times, preferably 10 to 200 times as high as that of the deposition gas containing silicon or germanium. Note that in a typical example of a condition for forming a normal amorphous semiconductor film, the flow rate of hydrogen is 0 to 5 times that of the deposition gas containing silicon or germanium.

A rare gas such as helium, argon, neon, xenon, or krypton may be introduced into the source gas of the semiconductor film 111, so that the deposition rate can be increased.

It is preferable that the thickness of the semiconductor film 111 be 50 nm to 350 nm, further preferably 120 nm to 250 nm.

Figure 5A:
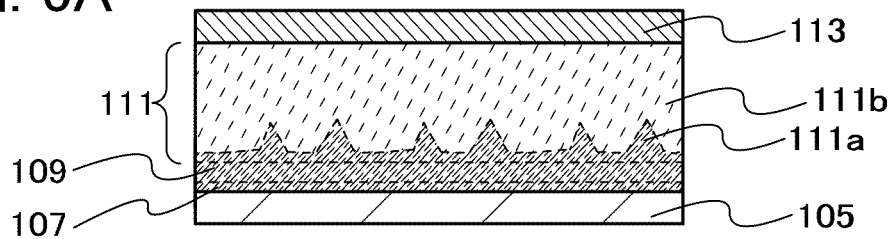
FIGS. 5A and 5B are cross-sectional views illustrating a method for manufacturing a semiconductor device according to one embodiment of the present invention.
Figure 5B:
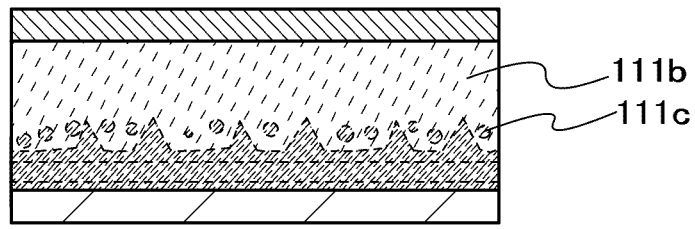

FIGS. 5A and 5B are enlarged views of the portion between the gate insulating film 105 and the impurity semiconductor film 113 shown in FIG. 4C.

As illustrated in FIG. 5A, the microcrystalline semiconductor region 111a of the semiconductor film 111 has a projected portion and a depressed portion; the microcrystalline semiconductor region 111a has a projecting (conical or pyramidal) shape whose width decreases from the gate insulating film 105 side toward the amorphous semiconductor region 111b (a tip of the projected portion has an acute angle). Alternatively, the microcrystalline semiconductor region 111a may have a projecting (inverted conical or pyramidal) shape whose width increases from the gate insulating film 105 toward the amorphous semiconductor region 111b.

The thickness of the first microcrystalline semiconductor film 107, the second microcrystalline semiconductor film 109 and the microcrystalline semiconductor region 111a, that is, the distance from the interface between the gate insulating film 105 and the first microcrystalline semiconductor film 107 to the tip of the projection of the microcrystalline semiconductor region 111a may be set to greater than or equal to 5 nm and less than or equal to 310 nm, so that the off-state current of the thin film transistor can be reduced.

Further, in order to improve the crystallinity of the microcrystalline semiconductor region 111a, it is preferable that the concentration of oxygen contained in the semiconductor film 111, which are measured by secondary ion mass spectrometry, be less than $1\times10^{18}$ atoms/$cm^3$. The nitrogen concentration profile of the semiconductor film 111 that is measured by secondary ion mass spectrometry has a peak concentration greater than or equal to $1\times10^{20}$ atoms/$cm^3$ and less than or equal to $1\times10^{21}$ atoms/$cm^3$, preferably greater than or equal to $2\times10^{20}$ atoms/$cm^3$ and less than or equal to $1\times10^{21}$ atoms/$cm^3$.

The amorphous semiconductor region 111b is formed using an amorphous semiconductor containing nitrogen. Nitrogen in the amorphous semiconductor exists, for example, as an NH group or an $NH_2$ group. The amorphous semiconductor is formed using amorphous silicon.

The amorphous semiconductor containing nitrogen is a semiconductor having a smaller amount of the defect absorption spectrum and low energy at an Urbach edge, measured by a constant photocurrent method (CPM) or photoluminescence spectroscopy, than a conventional amorphous semiconductor. That is, as compared to the conventional amorphous semiconductor, the amorphous semiconductor containing nitrogen is a well-ordered semiconductor having fewer defects and a steep tail of a level at a band edge in the valence band. Since the amorphous semiconductor containing nitrogen has a steep tail of a level at a band edge in the valence band, the band gap is wide and tunneling current does not easily flow. Therefore, by providing the amorphous semiconductor containing nitrogen between the microcrystalline semiconductor region 111a and the impurity semiconductor film 113, the off-state current of the thin film transistor can be reduced. In addition, by providing the amorphous semiconductor containing nitrogen, the on-state current and the field-effect mobility can be increased.

Further, a peak region of a spectrum of the amorphous semiconductor including nitrogen obtained with low-temperature photoluminescence spectroscopy is greater than or equal to 1.31 eV and less than or equal to 1.39 eV. Note that a peak region of a spectrum of a microcrystalline semiconductor, typically microcrystalline silicon, obtained with low-temperature photoluminescence spectroscopy, is greater than or equal to 0.98 eV and less than or equal to 1.02 eV. Accordingly, the amorphous semiconductor including nitrogen is different from a microcrystalline semiconductor.

Further, in addition to the amorphous semiconductor region 111b, the microcrystalline semiconductor region 111a may also contain an NH group or an $NH_2$ group.

Further, as illustrated in FIG. 5B, a semiconductor mixed phase grain 111c whose particle size is greater than or equal to 1 nm and less than or equal to 10 nm, preferably greater than or equal to 1 nm and less than or equal to 5 nm may be included in the amorphous semiconductor region 111b, so that the on-state current and the filed-effect mobility can be further increased.

The microcrystalline semiconductor having a projected (conical or pyramidal) shape whose width decreases from the gate insulating film 105 toward the amorphous semiconductor region 111b is formed in the following manner: after the second microcrystalline semiconductor film is formed, crystal growth is performed under a condition that the crystal growth is partly conducted, and an amorphous semiconductor is deposited.

Since the microcrystalline semiconductor region 111a of the semiconductor film 111 has the conical or pyramidal shape or the inverted conical or pyramidal shape, resistance in the vertical direction (film thickness direction) under application of voltage between the source and drain electrodes in an on state, i.e., resistance of the semiconductor film 111 can be reduced. Further, less tunneling current flows by the provision of the amorphous semiconductor containing nitrogen between the microcrystalline semiconductor region 111a and the impurity semiconductor film 113 because the amorphous semiconductor including nitrogen is a well-ordered semiconductor which has fewer defects and whose tail of a level at a band edge in the valence band is steep. Thus, in the thin film transistor described in this embodiment, the on-state current and the field-effect mobility can be increased and the off-state current can be reduced.

In this embodiment, the semiconductor film 111 including the microcrystalline semiconductor region 111a and the amorphous semiconductor region 111b is formed using the source gas including the gas containing nitrogen. Alternatively, the semiconductor film 111 can be formed in the following manner: the top surface of the second microcrystalline semiconductor film 109 is exposed to a gas containing nitrogen so that nitrogen is adsorbed to the top surface of the second microcrystalline semiconductor film 109; and then film deposition is performed using a deposition gas including silicon or germanium and hydrogen as a source gas.

The impurity semiconductor film 113 is formed using amorphous silicon to which phosphorus is added, microcrystalline silicon to which phosphorus is added, or the like. The structure in which the phosphorous-doped amorphous silicon and the phosphorous-doped microcrystalline silicon are stacked can also be employed. In the case of forming a p-channel thin film transistor as a thin film transistor, the impurity semiconductor film 113 is formed using microcrystalline silicon to which boron is added, amorphous silicon to which boron is added, or the like. Note that, in the case where ohmic contact is formed between the semiconductor film 111 and the wirings 129a and 129b which are formed later, the impurity semiconductor film 113 is not necessarily formed.

The impurity semiconductor film 113 is formed by glow discharge plasma with the use of a mixture of hydrogen, phosphine (diluted with hydrogen or silane), and a deposition gas containing silicon in a process chamber of a plasma CVD apparatus, by which the amorphous silicon to which phosphorus is added or the microcrystalline silicon to which phosphorus is added is formed. In the case of forming a p-channel thin film transistor, the impurity semiconductor film 113 may be formed by glow discharge plasma using diborane instead of phosphine.

In the case where the impurity semiconductor film 113 is formed using amorphous silicon to which phosphorus is added or microcrystalline silicon to which boron is added, a microcrystalline semiconductor film, typically a microcrystalline silicon film may be formed between the semiconductor film 111 and the impurity semiconductor film 113, so that characteristics of the interface can be improved. Accordingly, the resistance generated at the interface between the impurity semiconductor film 113 and the semiconductor film 111 can be reduced. Consequently, the amount of current flowing through the source region, the semiconductor film, and the drain region of the thin film transistor can be increased, which enables increase in the on-state current and the field-effect mobility.

The resist mask 115 can be formed by a photolithography step.

Next, the first microcrystalline semiconductor film 107, the second microcrystalline semiconductor film 109, the semiconductor film 111, and the impurity semiconductor film 113 are etched using the resist mask 115. Through this step, the first microcrystalline semiconductor film 107, the second microcrystalline semiconductor film 109, the semiconductor film 111, and the impurity semiconductor film 113 are separated for each element, so that an island-shaped semiconductor stack 117 and an island-shaped impurity semiconductor film 121 are formed. The semiconductor stack 117 includes the first microcrystalline semiconductor film 107, the second microcrystalline semiconductor film 109, and the semiconductor film 111, and includes a microcrystalline semiconductor region 117a including the first microcrystalline semiconductor film 107, the second microcrystalline semiconductor film 109, and the microcrystalline semiconductor region of the semiconductor film 111, and an amorphous semiconductor region 117b including the amorphous semiconductor region of the semiconductor film 111. Then, the resist mask 115 is removed (see FIG. 4D).

Figure 6A:
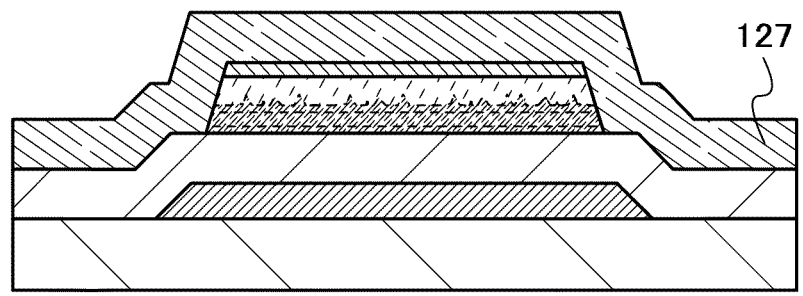
FIGS. 6A to 6C are cross-sectional views illustrating a method for manufacturing a semiconductor device according to one embodiment of the present invention.

Next, a conductive film 127 is formed over the impurity semiconductor film 121 (see FIG. 6A). The conductive film 127 can be formed as a single layer or a stacked layer using aluminum, copper, titanium, neodymium, scandium, molybdenum, chromium, tantalum, tungsten, and the like. An aluminum alloy to which an element for preventing a hillock is added (e.g., an Al—Nd alloy which can be used for the gate electrode layer 103) may also be used. Alternatively, crystalline silicon to which an impurity element which serves as a donor is added may be used. A stacked-layer structure in which a film on the side that is in contact with the crystalline silicon to which an impurity element serving as a donor is added is formed using titanium, tantalum, molybdenum, tungsten, or nitride of any of these elements, and aluminum or an aluminum alloy is formed thereover may be employed. Moreover, the conductive film 127 may have a stacked-layer structure in which an upper side and a lower side of aluminum or an aluminum alloy is sandwiched together with titanium, tantalum, molybdenum, tungsten, or nitride of any of these elements. The conductive film 127 is formed by a CVD method, a sputtering method, or a vacuum evaporation method. Alternatively, the conductive film 127 may be formed by discharging a conductive nanopaste of silver, gold, copper, or the like by a screen printing method, an ink-jet method, or the like and baking the conductive nanopaste.

Figure 6B:
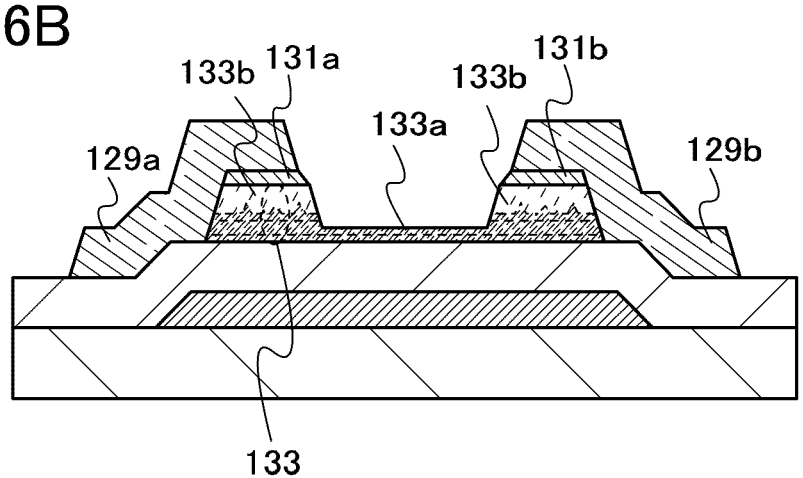

Next, a resist mask is formed by a photolithography step, and the conductive film 127 is etched with the use of the resist mask, to form the wirings 129a and 129b serving as a source electrode and a drain electrode (see FIG. 6B). The etching of the conductive film 127 may be either dry etching or wet etching. Note that one of the wirings 129a and 129b serves as a signal line as well as a source electrode or a drain electrode. However, without limitation thereto, a signal line may be provided separately from the source and drain electrodes.

Next, the impurity semiconductor film 121 and part of the semiconductor stack 117 are etched, so that a pair of impurity semiconductor films 131a and 131b serving as a source region and a drain region are formed. Also, the semiconductor stack 133 including the microcrystalline semiconductor region 133a and a pair of amorphous semiconductor regions 133b is formed. The etching on the semiconductor stack 117 is performed so that the microcrystalline semiconductor region 133a is exposed, whereby the semiconductor stack 133 is formed in which the microcrystalline semiconductor region 133a and the amorphous semiconductor regions 133b are stacked in a region which is covered with the wiring 129a, 129b, and the microcrystalline semiconductor region 133a is exposed in a region which is not covered with the wiring 129a, 129b but overlaps with the gate electrode.

Here, ends of the wirings 129a and 129b are aligned with ends of the impurity semiconductor films 131a and 131b, respectively. However, the ends of the wirings 129a and 129b may be deviated from the ends of the impurity semiconductor films 131a and 131b, respectively. In a cross section in such a case, the ends of the wirings 129a and 129b may be positioned on the inner side than the ends of the impurity semiconductor films 131a and 131b, respectively.

Next, dry etching may be performed. The dry etching is performed at a low etching rate of the microcrystalline semiconductor region 133a and the amorphous semiconductor regions 133b so that the exposed microcrystalline semiconductor region 133a and the amorphous semiconductor regions 133b are not damaged. As an etching gas, $Cl_2$, $CF_4$, $N_2$, or the like is typically used. There is no particular limitation on an etching method, and an inductively coupled plasma (ICP) method, a capacitively coupled plasma (CCP) method, an electron cyclotron resonance (ECR) method, a reactive ion etching (RIE) method, or the like can be used.

Next, the surfaces of the microcrystalline semiconductor region 133a and the amorphous semiconductor regions 133b are subjected to plasma treatment, typically, water plasma treatment, oxygen plasma treatment, ammonia plasma treatment, nitrogen plasma treatment, or the like.

The water plasma treatment can be performed by generating plasma using a gas containing water as its main component typified by water vapor ($H_2O$ vapor) introduced into the reaction space. After that, the resist mask is removed. The resist mask may be removed before the dry etching on the impurity semiconductor film 121 and the semiconductor stack 117.

As described above, after the microcrystalline semiconductor region 133a and the amorphous semiconductor regions 133b are formed, the dry etching is additionally performed under the condition that no damage is given to the microcrystalline semiconductor region 133a and the amorphous semiconductor regions 133b, whereby an impurity such as a residual left over the exposed microcrystalline semiconductor region 133a and the amorphous semiconductor regions 133b can be removed. Further, the water plasma treatment follows the dry etching, whereby a residue of the resist mask can be removed and a defect of the microcrystalline semiconductor region 133a can be reduced. Furthermore, by the plasma treatment, insulation between the source region and the drain region can be ensured, and thus, in a thin film transistor which is completed, off-state current can be reduced, and variation in electric characteristics can be reduced.

Through the above-described process, a single-gate thin film transistor can be manufactured. Further, a single-gate thin film transistor with low off-state current, high on-state current, and high field-effect mobility can be manufactured with high productivity.

Next, an insulating film 137 (also referred to as a second gate insulating film) is formed over the semiconductor stack 133 and the wirings 129a and 129b. The insulating film 137 can be formed in a manner similar to that for the gate insulating film 105.

Next, an opening (not shown) is formed in the insulating film 137 with the use of a resist mask formed by a photolithography step. Next, a back-gate electrode 139 (also referred to as a second gate electrode) is formed over the insulating film 137 (see FIG. 6C). Through the above-described process, a dual-gate thin film transistor can be manufactured.

The back-gate electrode 139 can be formed in a manner similar to that of the wirings 129a and 129b. Further, the back-gate electrode 139 can be formed using a light-transmitting conductive material such as indium oxide including tungsten oxide, indium zinc oxide including tungsten oxide, indium oxide including titanium oxide, indium tin oxide including titanium oxide, indium tin oxide, indium zinc oxide, or indium tin oxide to which silicon oxide is added.

Alternatively, the back-gate electrode 139 can be formed using a conductive composition containing a light-transmitting conductive high molecule (also referred to as conductive polymer). The back-gate electrode 139 preferably has a sheet resistance of less than or equal to 10000 Ω/sq. and a light transmittance of greater than or equal to 70% at a wavelength of 550 nm. Further, the resistivity of the conductive high molecule included in the conductive composition is preferably less than or equal to 0.1 Ω·cm.

As the conductive high molecule, a so-called π-electron conjugated conductive high molecule can be used. For example, polyaniline or a derivative thereof, polypyrrole or a derivative thereof, polythiophene or a derivative thereof, a copolymer of two or more of aniline, pyrrole, and thiophene or a derivative thereof, or the like can be used.

The back-gate electrode 139 can be formed in the following manner: a thin film is formed using any of the materials described above by a sputtering method; and the thin film is etched using a resist mask that is formed by a photolithography step. Alternatively, a conductive composition including a light-transmitting conductive high molecule is applied or printed, and baked to form the back-gate electrode 139.

Next, a form of the back-gate electrode is described with reference to FIGS. 7A to 7D that are top views of the thin film transistors.

Figure 7A:
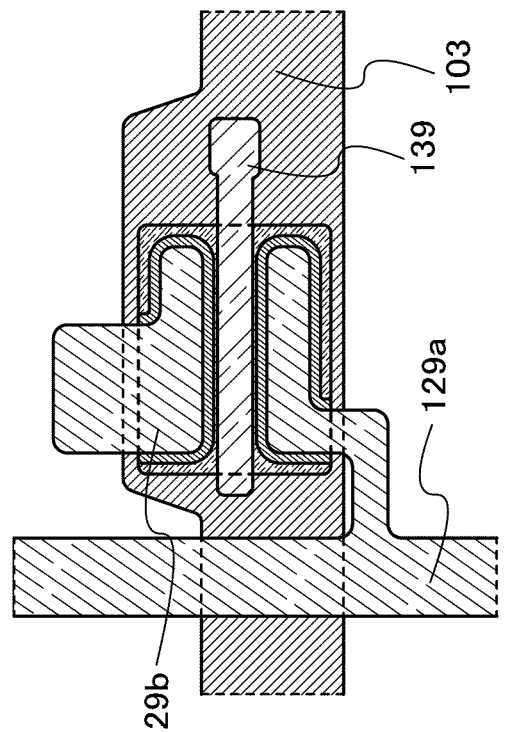
FIGS. 7A to 7D are top views illustrating a method for manufacturing a semiconductor device according to one embodiment of the present invention.

As illustrated in FIG. 7A, the back-gate electrode 139 can be formed in parallel to the gate electrode 103. In this case, each of potential applied to the back-gate electrode 139 and potential applied to the gate electrode 103 can be controlled independently. Thus, the threshold voltage of the thin film transistor can be controlled. Further, regions in which carriers flow, that is, channel regions, are formed on the gate insulating film 105 side and on the insulating film 137 side in the microcrystalline semiconductor region; thus, the on-state current of the thin film transistor can be increased.

Figure 7B:
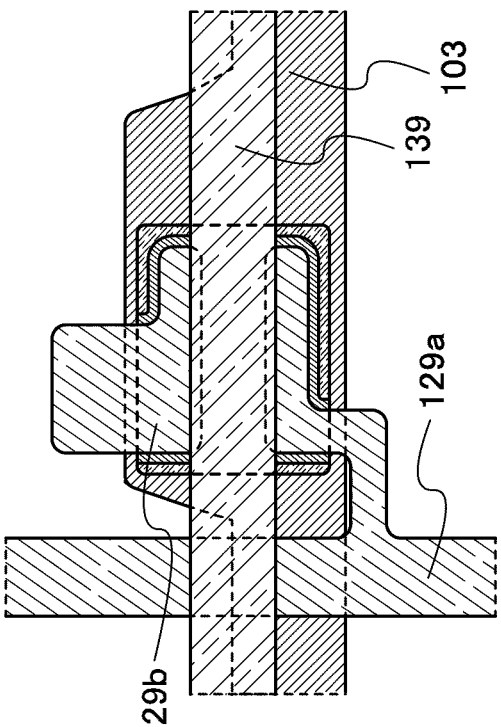

As illustrated in FIG. 7B, the back-gate electrode 139 can be connected to the gate electrode 103. That is, the gate electrode 103 and the back-gate electrode 139 can be connected through an opening 150 formed in the gate insulating film 105 and the insulating film 137. In this case, potential applied to the back-gate electrode 139 and potential applied to the gate electrode 103 are equivalent. As a result, in the microcrystalline semiconductor region in the semiconductor film, regions in which carriers flow, that is, channel regions are formed on the gate insulating film 105 side and on the insulating film 137 side; thus, the on-state current of the thin film transistor can be increased.

Figure 7C:
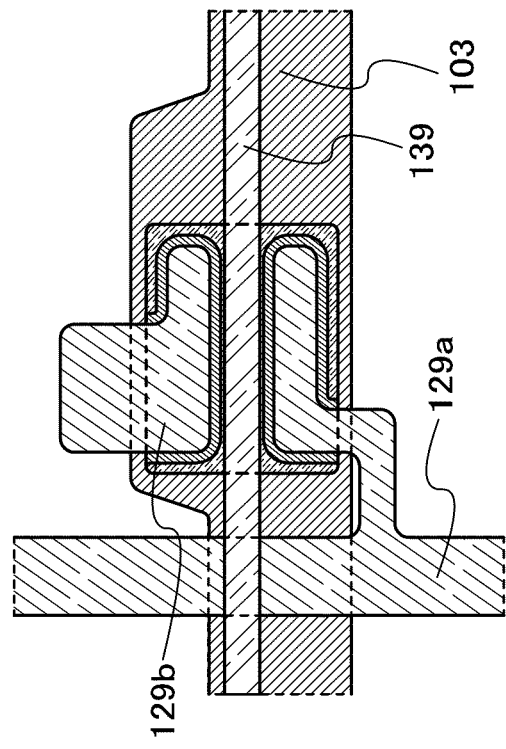

Further alternatively, as illustrated in FIG. 7C, the back-gate electrode 139 is not necessarily connected to the gate electrode 103 but may be in a floating state. In that case, channel regions are formed on the gate insulating film 105 side and on the insulating film 137 side in the microcrystalline semiconductor region without applying potential to the back-gate electrode 139; thus, the on-state current of the thin film transistor can be increased.

Figure 7D:
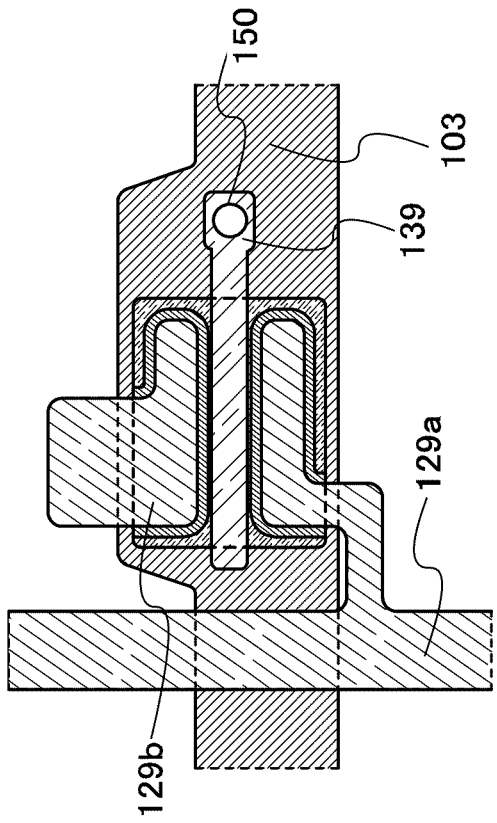

As illustrated in FIG. 7D, the back-gate electrode 139 may overlap with the wirings 129a and 129b with the insulating film 137 provided therebetween. Although FIG. 7D illustrates the case of using the back-gate electrode 139 illustrated in FIG. 7A, the back-gate electrode 139 of FIG. 7B or FIG. 7C may be made to overlap with the wirings 129a and 129b as well.

In the single-gate thin film transistor and the dual-gate thin film transistor which are described in this embodiment, the channel region can be formed using a microcrystalline semiconductor film having high crystallinity with the space between the mixed phase grains reduced. Therefore, in the single-gate thin film transistor and dual-gate thin film transistor, the amount of transferring carriers is increased, so that the on-state current and the field-effect mobility can be increased. Further, the amorphous semiconductor regions 133b are formed between the microcrystalline semiconductor region 133a and the impurity semiconductor films 131a and 131b. Therefore, the off-state current of the thin film transistor can be reduced. Accordingly, the area of the single-gate thin film transistor or the area of the dual-gate thin film transistor can be reduced, which enables high integration of a semiconductor device. Further, when the thin film transistor described in this embodiment is used for a driver circuit of a display device, the size of the driver circuit can be decreased, which enables the frame of the display device to be narrowed. Furthermore, as described in Embodiment 1, an i-type microcrystalline semiconductor film in which the activation energy is 0.5 eV to 0.6 eV is formed in a channel region, whereby a normally-off thin film transistor having the effects described above can be manufactured.

Note that, in this embodiment, the microcrystalline semiconductor film is formed using Embodiment 1; however, the microcrystalline semiconductor film can be formed using Embodiment 2. Further, when a dual-gate thin film transistor is formed using the microcrystalline semiconductor film described in Embodiment 2, the crystallinity of the microcrystalline semiconductor film is high on the back-gate electrode side, so that the dual-gate thin film transistor can have further excellent electric characteristics.

EMBODIMENT 4

In this Embodiment, a method for manufacturing a thin film transistor, by which the off-state current can be further reduced as compared with Embodiment 3 will be described with reference to FIGS. 4A to 4D and FIGS. 8A to 8C.

Figure 8A:
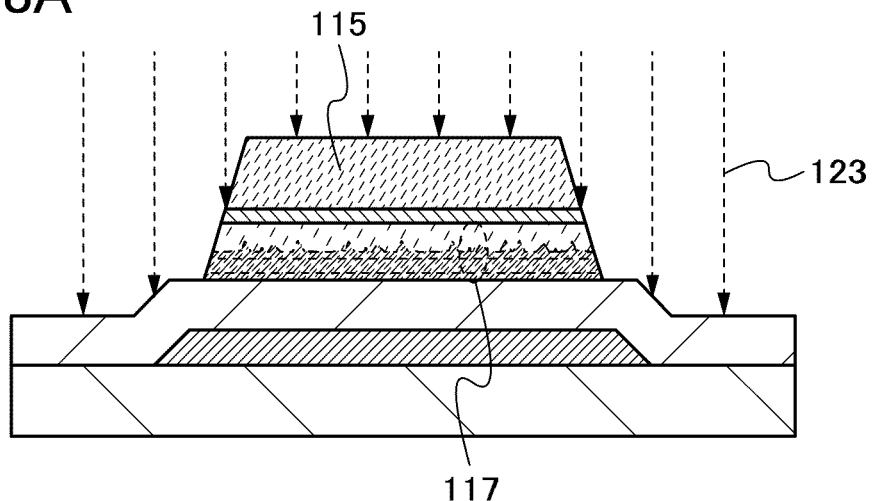
FIGS. 8A to 8C are cross-sectional views illustrating a method for manufacturing a semiconductor device according to one embodiment of the present invention.

In a manner similar to Embodiment 3, the semiconductor stack 117 as illustrated in FIG. 8A is formed through the process illustrated in FIGS. 4A to 4C.

Next, plasma treatment is performed in which a side surface of the semiconductor stack 117 is exposed to plasma 123 with the resist mask 115 left. Here, plasma is generated in an oxidation gas atmosphere or a nitriding gas atmosphere, and the semiconductor stack 117 is exposed to the plasma 123. Examples of the oxidation gas include oxygen, ozone, dinitrogen monoxide, water vapor, a mixed gas of oxygen and hydrogen, and the like. Examples of the nitriding gas include nitrogen, ammonia, nitrogen fluoride, nitrogen chloride, chloroamine, fluoroamine, and the like. Generation of plasma in an oxidation gas or a nitriding gas causes an oxygen radical or a nitrogen radical. The radical reacts with the semiconductor stack 117, which can form an insulating region functioning as a bank region on the side surface of the semiconductor stack 117. Note that instead of irradiation with plasma, irradiation with ultraviolet light may be employed for generation of an oxygen radical or a nitrogen radical.

Figure 8B:
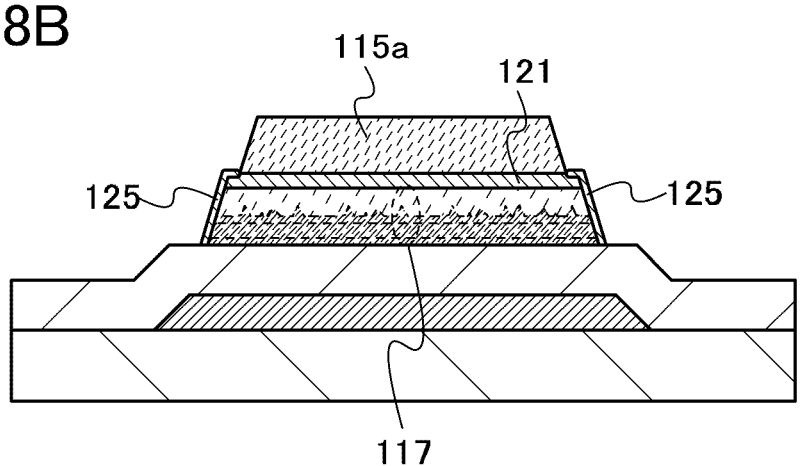
Figure 8C:
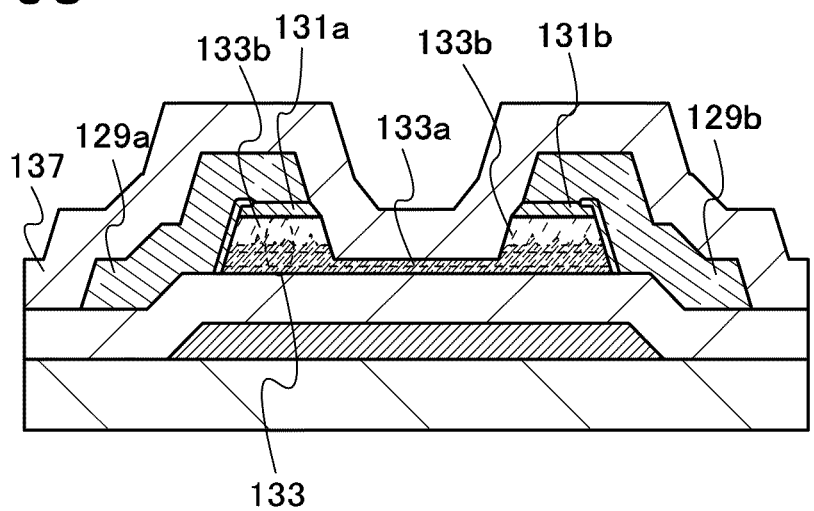

In the case of using oxygen, ozone, water vapor, or a mixed gas of oxygen and hydrogen as the oxidation gas, the resist recedes by plasma irradiation, so that a resist mask 115a whose top surface is smaller than that of the resist mask 115 is formed as shown in FIG. 8B. Consequently, by the plasma treatment, the exposed impurity semiconductor film 121 is oxidized in addition to the side wall of the semiconductor stack 117, so that an insulating region 125 functioning as a bank region is formed on the side wall and part of the top surface of the impurity semiconductor film 121 and the side wall of the semiconductor stack 117.

Figure 6C:
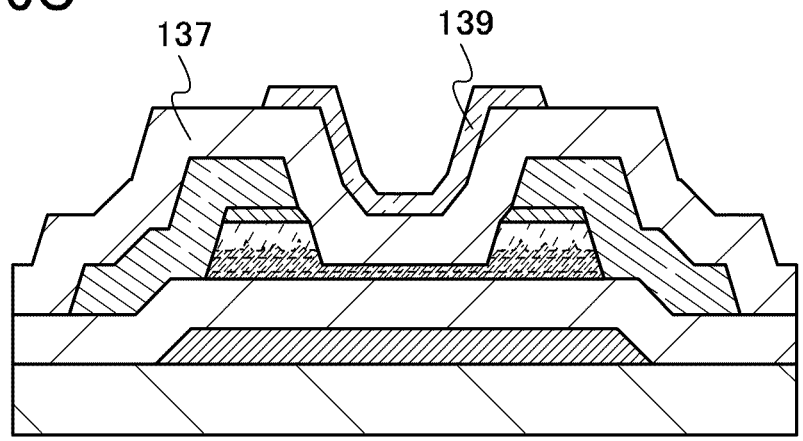

Next, as described in Embodiment 3, through the process illustrated in FIGS. 6A and 6B, the wirings 129a and 129b functioning as a source electrode and a drain electrode, the pair of impurity semiconductor films 131a and 131b functioning as a source region and a drain region, the semiconductor stack 133 including the microcrystalline semiconductor region 133a and the pair of amorphous semiconductor regions 133b, and the insulating film 137 are formed as illustrated in FIG. 6C. Accordingly, a single-gate thin film transistor can be manufactured.

Further, a back-gate electrode may be formed over the insulating film 137 to manufacture a dual-gate thin film transistor.

In the single-gate thin film transistor and the dual-gate thin film transistor which are described in this embodiment, the channel region can be formed using a microcrystalline semiconductor film having high crystallinity with the space between the mixed phase grains reduced. Furthermore, since the insulating region which is a bank region is provided between the semiconductor stack 133 and the wirings 129a and 129b, hole injection from the wirings 129a and 129b to the semiconductor stack 133 can be reduced, so that the off-state current of the thin film transistor is reduced and the on-state current and the field-effect mobility thereof are increased. Therefore, the size of the thin film transistor can be decreased, and high integration of a semiconductor device can be achieved. Further, when the thin film transistor described in this embodiment is used for a driver circuit of a display device, the size of the driver circuit can be decreased, which enables the frame of the display device to be narrowed.

Although the description is made using Embodiment 3 in this embodiment, any other embodiments can be used as appropriate.

EMBODIMENT 5

Figure 9:
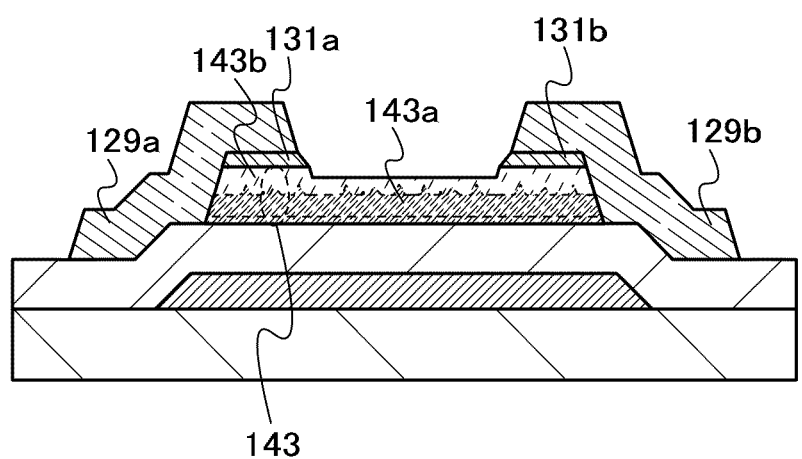
FIG. 9 is a cross-sectional view illustrating a method for manufacturing a semiconductor device according to one embodiment of the present invention.

In this embodiment, a method for manufacturing a thin film transistor formed in the semiconductor device that is one embodiment of the present invention is described with reference to FIGS. 5A and 5B, FIGS. 6A to 6C, and FIG. 9. FIG. 9 corresponds to the step illustrated in FIG. 6B.

In a manner similar to Embodiment 3, through the steps illustrated in FIGS. 4A to 4D and FIG. 6A, a conductive film 127 is formed.

Next, as illustrated in FIG. 9, in a manner similar to Embodiment 3, the wirings 129a and 129b are formed, and the impurity semiconductor film 121 and part of the semiconductor stack 117 are etched, so that a pair of impurity semiconductor films 131a and 131b serving as a source region and a drain region are formed. Also by this etching, a semiconductor stack 143 including a microcrystalline semiconductor region 143a and an amorphous semiconductor region 143b is formed. The etching of the semiconductor stack 117 (see FIG. 4D) is performed so that the amorphous semiconductor region 143b is exposed, whereby the semiconductor stack 143 is formed in which the microcrystalline semiconductor region 143a and the amorphous semiconductor region 143b are stacked in a region which is covered with the wiring 129a, 129b, and the microcrystalline semiconductor region 143a is not exposed and the amorphous semiconductor region 143b is exposed in a region which is not covered with neither the wiring 129a nor the wiring 129b but overlaps with the gate electrode. Note that the etching amount of the semiconductor stack 117 here is smaller than that of FIG. 6B.

The subsequent steps are similar to those in Embodiment 3.

Through the above-described process, a single-gate thin film transistor can be manufactured. The thin film transistor is amorphous on the back channel side, whereby the thin film transistor can have a lower off-state current than the thin film transistor illustrated in FIG. 6B.

In this embodiment, after the step of FIG. 9 in a manner similar to the step illustrated in FIG. 6C, the back-gate electrode 139 may be formed thereover with the insulating film 137 provided therebetween.

This embodiment can be implemented in appropriate combination with the other embodiments.

EMBODIMENT 6

A thin film transistor is manufactured, and a semiconductor device having a display function (also referred to as a display device) can be manufactured using the thin film transistor in a pixel portion and further in a driver circuit. Further, when part or whole of a driver circuit using a thin film transistor is formed over the same substrate as a pixel portion, a system-on-panel can be obtained.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

In addition, the display device includes a panel in which the display element is sealed, and a module in which an IC or the like including a controller is mounted on the panel. Furthermore, an element substrate, which corresponds to one embodiment before the display element is completed in a manufacturing process of the display device, is provided with a means for supplying current to the display element in each of a plurality of pixels. Specifically, the element substrate may be in a state after only a pixel electrode of the display element is formed, a state after a conductive film to serve as a pixel electrode is formed, and before the conductive film is etched to form the pixel electrode, or any of other states.

Note that a display device in this specification means an image display device, a display device, or a light source (including a lighting device). Further, the display device includes the following modules in its category: a module including a connector such as a flexible printed circuit (FPC), a tape automated bonding (TAB) tape, or a tape carrier package (TCP) attached; a module having a TAB tape or a TCP which is provided with a printed wiring board at the end thereof; and a module having an integrated circuit (IC) which is directly mounted on a display element by a chip on glass (COG) method.

EMBODIMENT 7

In this embodiment, a photoelectric conversion device that is one embodiment of a semiconductor device is described. In the photoelectric conversion device described in this embodiment, as described in Embodiment 1 and Embodiment 2, a microcrystalline semiconductor film having high crystallinity with the space between mixed phase grains reduced is used as a semiconductor film. The microcrystalline semiconductor film having high crystallinity with the space between mixed phase grains reduced is applicable to a semiconductor film for photoelectric conversion, a semiconductor film having a conductivity type, or the like, and is preferably applied to the semiconductor film for photoelectric conversion in particular. Further, the microcrystalline semiconductor film having high crystallinity with the space between mixed phase grains reduced can be provided at an interface between the semiconductor film for photoelectric conversion or the semiconductor film having a conductivity type and another film.

By employing the structure described above, resistance (series resistance) caused by the semiconductor film for photoelectric conversion or the semiconductor film having a conductivity type can be reduced, resulting in improvement of characteristics of the photoelectric conversion device. Further, it is possible to suppress optical and electrical loss at the interface between the semiconductor film for photoelectric conversion or the semiconductor film having a conductivity type and another film, so that the photoelectric conversion efficiency can be improved. With reference to FIGS. 10A to 10E, one embodiment of a method for manufacturing a photoelectric conversion device will now be described.

Figure 10A:
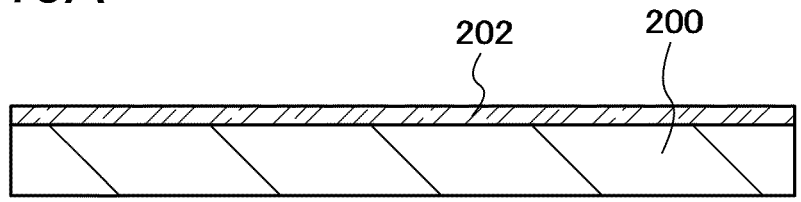
FIGS. 10A to 10E are cross-sectional views illustrating one embodiment of a method for manufacturing a photoelectric conversion device.

As illustrated in FIG. 10A, a first electrode 202 is formed over a substrate 200.

As the substrate 200, the substrate 51 described in Embodiment 1 can be used as appropriate. Alternatively, a plastic substrate can be used. As the plastic substrate, it is preferable to use a substrate containing a thermosetting resin such as an epoxy resin, unsaturated polyester resin, a polyimide resin, a bismaleimide-triazine resin, or a cyanate resin, or a substrate containing a thermoplastic resin such as a poly(phenylene oxide) resin, a polyetherimide resin, or a fluorine resin.

Note that the substrate 200 may have a texture structure. Accordingly, photoelectric conversion efficiency can be improved.

In this embodiment, since light enters from the back side (the lower part in the drawing) of the substrate 200, a light-transmitting substrate is used. However, the present invention is not limited thereto. In the case where light enters from the side of the second electrode 210 which is formed later (the upper part in the drawing), a semiconductor substrate containing a material such as silicon or a conductive substrate containing a metal material or the like may be used.

The first electrode 202 can be formed using the light-transmitting conductive material used for the back-gate electrode 139 described in Embodiment 3. The first electrode 202 is formed by a sputtering method, a CVD method, a vacuum evaporation method, a coating method, a printing method, or the like.

The first electrode 202 is formed to a thickness of 10 nm to 500 nm, preferably 50 nm to 100 nm. The sheet resistance of the first electrode 202 is set to about 20 $\Omega$/sq. to 200 $\Omega$/sq.

Note that in this embodiment, since light enters from the back side (the lower part in the drawing) of the substrate 200, the first electrode 202 is formed using a light-transmitting conductive material. However, the present invention is not limited thereto. In the case where light enters from the side of the second electrode 210 which is formed later (the upper part in the drawing), the first electrode 202 can be formed using a conductive material that does not have a light-transmitting property such as aluminum, platinum, gold, silver, copper, titanium, tantalum, or tungsten. In particular, when a material that easily reflects light, such as aluminum, silver, titanium, or tantalum, is used, photoelectric conversion efficiency can be sufficiently improved.

Like the substrate 200, the first electrode 202 may have a texture structure. Further, an auxiliary electrode formed using a low-resistant conductive material may be separately formed so as to be in contact with the first electrode 202.

Figure 10B:
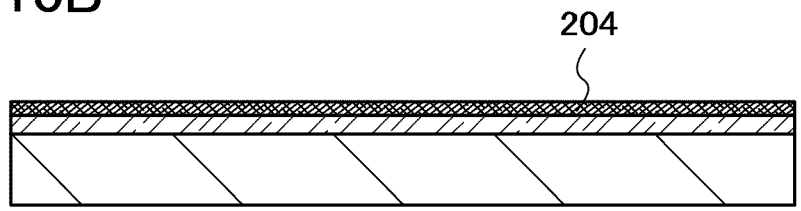

Next, as illustrated in FIG. 10B, a semiconductor film 204 having the first conductivity type is formed over the first electrode 202. The semiconductor film 204 having the first conductivity type is typically formed using a semiconductor film containing a semiconductor material to which an impurity element imparting a conductivity type is added. Silicon is suitable for the semiconductor material, considering productivity, a price, or the like. When silicon is used as the semiconductor material, phosphorus or arsenic, which imparts n-type conductivity, aluminum or boron, which imparts p-type conductivity, or the like is used as the impurity element imparting a conductivity type.

In this embodiment, since light enters from the back side (the lower part in the drawing) of the substrate 200, the conductivity type (first conductivity type) of the semiconductor film 204 having the first conductivity type is preferably a p-type. This is because, for instance, the diffusion length of holes is short as a result of the lifetime of a hole which is as short as half that of an electron, and because more electrons and holes are formed on the side where light enters in the semiconductor film 206 for photoelectric conversion. By applying a p-type to the first conductivity type, a current can be extracted before holes are annihilated, whereby a decrease of photoelectric conversion efficiency can be suppressed. Note that when there is no possibility of the above problems, for example, when the semiconductor film 206 for photoelectric conversion is sufficiently thin, the first conductivity type may be an n-type.

There are other semiconductor materials which can be used for the semiconductor film 204 having the first conductivity type, such as silicon carbide, germanium, gallium arsenide, indium phosphide, zinc selenide, gallium nitride, and silicon germanium. Alternatively, a semiconductor material including an organic material, a semiconductor material including a metal oxide, or the like can be used. The material which can be used for the semiconductor film 204 having the first conductivity type can be selected as appropriate in consideration of the semiconductor film 206 for photoelectric conversion.

Although there is no particular limitation on the crystallinity of the semiconductor film 204 having the first conductivity type, the microcrystalline semiconductor film having high crystallinity with the space between mixed phase grains reduced which is described in Embodiment 1 or Embodiment 2 is preferably used as the semiconductor film 204. This is because in this case, as compared with use of a conventional microcrystalline semiconductor film, it is possible to reduce series resistance and to suppress optical and electrical loss at the interface between the semiconductor film 204 having the first conductivity type and another film. It is needless to say that other semiconductors such as an amorphous semiconductor, a polycrystalline semiconductor, and a single crystal semiconductor can also be used.

Like the surface of the substrate 200, the semiconductor film 204 having the first conductivity type may have a texture structure.

The semiconductor film 204 having the first conductivity type can be formed using a deposition gas containing silicon and diborane by a plasma CVD method. Further, the semiconductor film 204 having the first conductivity type is formed to a thickness of 1 nm to 100 nm, preferably 5 nm to 50 nm.

Alternatively, the semiconductor film 204 having the first conductivity type may be formed in a manner such that a silicon film to which an impurity element imparting a conductivity type is not added is formed by a plasma CVD method or the like, which is followed by addition of boron by an ion implantation method or the like.

Figure 10C:
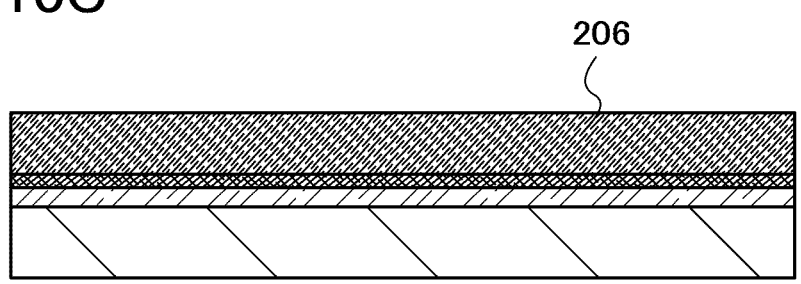

Next, as illustrated in FIG. 10C, the semiconductor film 206 for photoelectric conversion is formed over the semiconductor film 204 having the first conductivity type. For the semiconductor film 206 for photoelectric conversion, a semiconductor film using the semiconductor material which is the same as that of the semiconductor film 204 is used. That is, as the semiconductor material, silicon, silicon carbide, germanium, gallium arsenide, indium phosphide, zinc selenide, gallium nitride, silicon germanium, or the like is used. In particular, it is preferable to use silicon. Alternatively, a semiconductor material including an organic material, a semiconductor material including a metal oxide, or the like can be used.

As the semiconductor film 206 for photoelectric conversion, as described in Embodiment 1 or Embodiment 2, the microcrystalline semiconductor film having high crystallinity with the space between mixed phase grains reduced is preferably used. By applying the microcrystalline semiconductor film having high crystallinity with the space between mixed phase grains reduced described in Embodiment 1 and Embodiment 2 to the semiconductor film, as compared with use of a conventional microcrystalline semiconductor film, it is possible to reduce series resistance and to suppress optical and electrical loss at the interface between the semiconductor film and another film.

Because the semiconductor film 206 for photoelectric conversion needs to exhibit sufficient light absorption, it preferably has a thickness of about 100 nm to 10 μm.

Figure 10D:
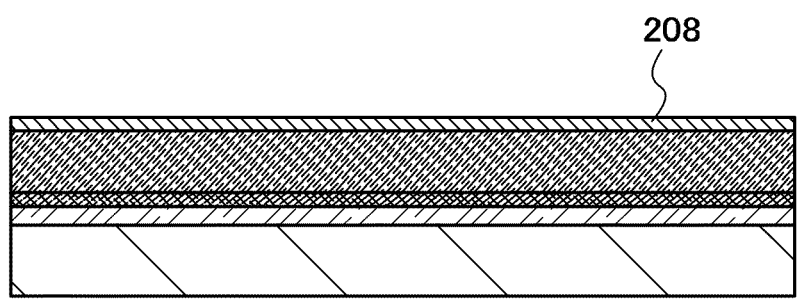

Next, as illustrated in FIG. 10D, a semiconductor film 208 having the second conductivity type is formed over the semiconductor film 206 for photoelectric conversion. In this embodiment, the second conductivity type is an n-type. The semiconductor film 208 having the second conductivity type can be formed using a material such as silicon to which phosphorus is added as an impurity element imparting a conductivity type. Semiconductor materials that can be used for the semiconductor film 208 having the second conductivity type are the same as those for the semiconductor film 204 having the first conductivity type.

The semiconductor film 208 having the second conductivity type can be formed in a manner similar to that of the semiconductor film 204 having the first conductivity type. For instance, the semiconductor film 208 can be formed using a deposition gas containing silicon and phosphine by a plasma CVD method. As the semiconductor film 208 having the second conductivity type, as described in Embodiment 1 or Embodiment 2, the microcrystalline semiconductor film having high crystallinity with the space between mixed phase grains reduced is preferably used.

In this embodiment, since light enters from the back side (the lower part in the drawing) of the substrate 200, the conductivity type (second conductivity type) of the semiconductor film 208 is preferably an n-type, but an embodiment of the present invention is not limited thereto. When the first conductivity type is an n-type, the second conductivity type is a p-type.

Figure 10E:
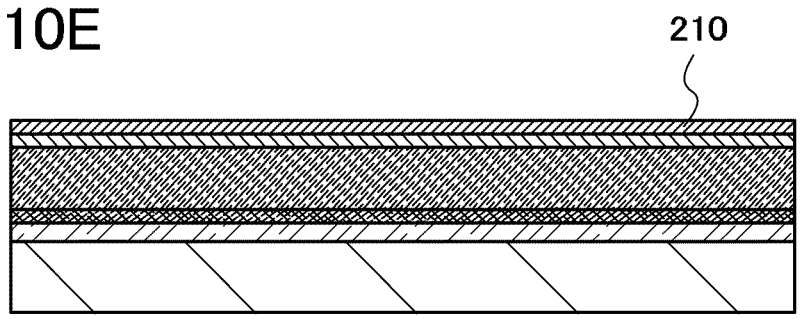

Then, as illustrated in FIG. 10E, a second electrode 210 is formed over the semiconductor film 208 having the second conductivity type. The second electrode 210 is formed using a conductive material such as metal. The second electrode 210 can be formed using a material that easily reflects light, such as aluminum, silver, titanium, or tantalum, for instance. In this case, such a material is preferably used because light that cannot be absorbed by the semiconductor film 206 can be incident on the semiconductor film 206 again; thus, photoelectric conversion efficiency can be improved.

As a method of forming the second electrode 210, there are a sputtering method, a vacuum evaporation method, a CVD method, a coating method, a printing method, and the like. The second electrode 210 is formed to a thickness of 10 nm to 500 nm, preferably 50 nm to 100 nm.

Note that, in this embodiment, since light enters from the back side (the lower part in the drawing) of the substrate 200, the second electrode 210 is formed using a material that has no light-transmitting property. However, the structure of the second electrode 210 is not limited thereto. For example, when light enters from the second electrode 210 side (the upper part in the drawing), the second electrode 210 can be formed using any of the light-transmitting conductive materials for the first electrode 202.

Further, an auxiliary electrode formed using a low-resistant conductive material may be formed so as to be in contact with the second electrode 210.

By the above method, it is possible to manufacture a photoelectric conversion device in which a microcrystalline semiconductor film having high crystallinity with the space between the mixed phase grains reduced is used as any of a semiconductor film for photoelectric conversion, a semiconductor film having a first conductivity type, and a semiconductor film having a second conductivity type. Accordingly, the photoelectric conversion efficiency of the photoelectric conversion device can be enhanced. Note that, as long as the microcrystalline semiconductor film having high crystallinity with the space between the mixed phase grains reduced is used as one of the semiconductor film for photoelectric conversion, the semiconductor film having the first conductivity type, and the semiconductor film having the second conductivity type, the film to which the microcrystalline semiconductor film is applied can be changed as appropriate. Further, when the microcrystalline semiconductor films having high crystallinity with the space between the mixed phase grains reduced are used as a plurality of films of the above semiconductor films, a greater effect can be achieved.

Note that although a photoelectric conversion device having one unit cell is described in this embodiment, a photoelectric conversion device in which two or more unit cells are stacked as appropriate can be provided.

This embodiment can be implemented in appropriate combination with the other embodiments.

EMBODIMENT 8

A semiconductor device disclosed in this specification can be applied to electronic paper. An electronic paper can be used for electronic appliances of a variety of fields as long as they can display data. For example, electronic paper can be applied to an e-book reader (e-book), a poster, a digital signage, a public information display (PID), an advertisement in a vehicle such as a train, displays of various cards such as a credit card, and the like. An example of the electronic appliances is illustrated in FIG. 11.

Figure 11:
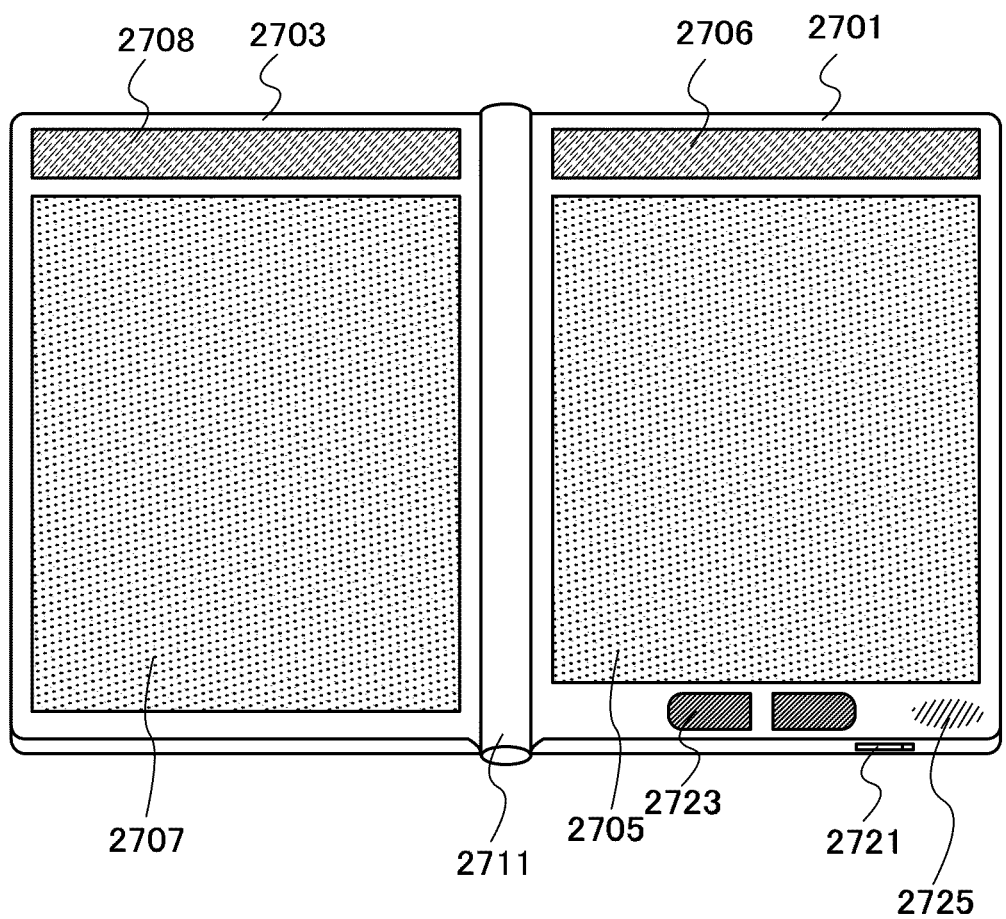
FIG. 11 is a perspective view illustrating an example of an e-book reader.

FIG. 11 illustrates an example of an e-book reader. For example, the e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a photoelectric conversion device 2706 are incorporated in the housing 2701. A display portion 2707 and a photoelectric conversion device 2708 are incorporated in the housing 2703. The display portion 2705 and the display portion 2707 may display one image or different images. In the case where the display portion 2705 and the display portion 2707 display different images, for example, text can be displayed on a display portion on the right side (the display portion 2705 in FIG. 11) and graphics can be displayed on a display portion on the left side (the display portion 2707 in FIG. 11).

FIG. 11 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may be provided on the same surface as the display portion of the housing. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

EMBODIMENT 9

A semiconductor device disclosed in this specification can be applied to a variety of electronic appliances (including game machines). Examples of electronic appliances are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 12A:
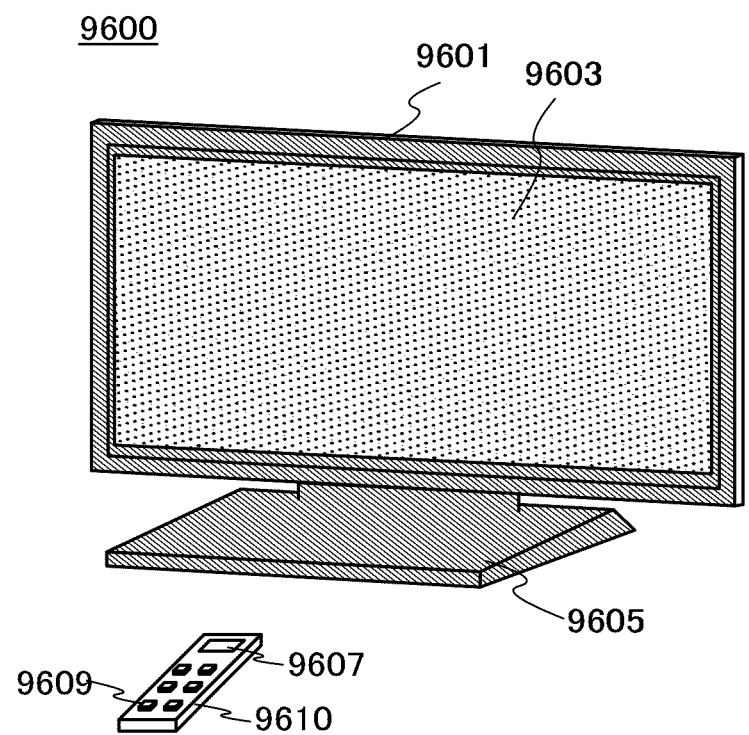
FIGS. 12A and 12B are external views showing examples of a television set and a digital photo frame.

FIG. 12A illustrates an example of a television set. In the television set 9600, a display portion 9603 is incorporated in a housing 9601. The display portion 9603 can display images. Further, in FIG. 12A, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 12B:
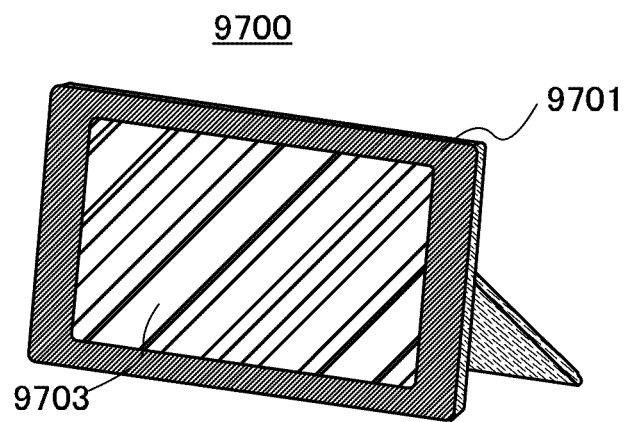

FIG. 12B illustrates an example of a digital photo frame. For example, in the digital photo frame 9700, a display portion 9703 is incorporated in a housing 9701. The display portion 9703 can display a variety of images. For example, the display portion 9703 can display data of an image taken with a digital camera or the like and function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive data wirelessly. Through wireless communication, desired image data can be loaded to be displayed.

Figure 13:
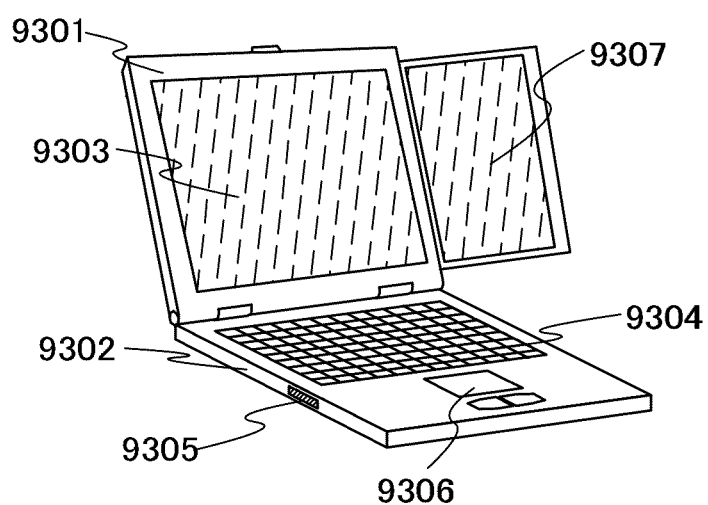
FIG. 13 is a perspective view illustrating an example of a portable computer.

FIG. 13 is a perspective view illustrating an example of a portable computer.

In the portable computer of FIG. 13, a top housing 9301 having a display portion 9303 and a bottom housing 9302 having a keyboard 9304 can overlap with each other by closing a hinge unit which connects the top housing 9301 and the bottom housing 9302. The portable computer of FIG. 13 is convenient for carrying, and in the case of using the keyboard for input, the hinge unit is opened and the user can input looking at the display portion 9303.

The bottom housing 9302 includes a pointing device 9306 with which input can be performed, in addition to the keyboard 9304. Further, when the display portion 9303 is a touch input panel, input can be performed by touching part of the display portion. Furthermore, the bottom housing 9302 includes an arithmetic function portion such as a CPU or hard disk. In addition, the bottom housing 9302 includes an external connection port 9305 into which another device such as a communication cable conformable to communication standards of a USB is inserted.

The top housing 9301 includes a display portion 9307 and can keep the display portion 9307 therein by sliding it toward the inside of the top housing 9301; thus, the top housing 9301 can have a large display screen. In addition, the user can adjust the orientation of a screen of the display portion 9307 which can be kept in the top housing 9301. When the display portion 9307 which can be kept in the top housing 9301 is a touch input panel, input can be performed by touching part of the display portion 9307 which can be kept in the top housing 9301.

The display portion 9303 or the display portion 9307 which can be kept in the top housing 9301 are formed with an image display device of a liquid crystal display panel, a light-emitting display panel such as an organic light-emitting element or an inorganic light-emitting element, or the like.

In addition, the portable computer illustrated in FIG. 13 can be provided with a receiver and the like to receive TV broadcasting to display images on the display portion. The user can watch a television broadcast with the whole screen of the display portion 9307 by sliding and exposing the display portion 9307 and adjusting the angle thereof, with the hinge unit which connects the top housing 9301 and the bottom housing 9302 closed. In this case, the hinge unit is not opened and display is not performed on the display portion 9303. In addition, start up of only a circuit for displaying television broadcast is performed. Therefore, power can be consumed to the minimum, which is useful for the portable computer whose battery capacity is limited.

EXAMPLE 1

In this example, it was confirmed that, as compared with the microcrystalline silicon film which is formed under the first condition described in Embodiment 1, in a microcrystalline silicon film which is formed under the second condition after the first condition described in Embodiment 1, the surface thereof is more even, and the mixed phase grains which are in closer contact are formed. Specific description thereof is given below.

First, a method for manufacturing Sample 1 and Sample 2 is described.

The microcrystalline silicon film having a thickness of 200 nm, which is Sample 1 of a comparative example, was formed over a quartz (silicon oxide) substrate having a thickness of 0.7 mm. The microcrystalline silicon film of Sample 1 was formed using only the first condition (one step). As the first condition, a plasma CVD method was used in which plasma discharge was performed in the following conditions: silane, hydrogen, and argon were introduced as source gases at the flow rates of 4 sccm, 750 sccm, and 750 sccm, respectively, and the flow rates were stabilized; the pressure of a process chamber was set to 532 Pa; the RF power source frequency was 13.56 MHz; the power of an RF power source was 150 W; the temperature of the upper electrode was 250° C.; and the temperature of the lower electrode was 290° C.

The microcrystalline silicon film of Sample 2 which is an embodiment example was formed as follows: a first microcrystalline silicon film having a thickness of 5 nm was formed under the first condition over a quartz (silicon oxide) substrate having a thickness of 0.7 mm, and then, a second microcrystalline silicon film having a thickness of 195 nm was formed under the second condition thereover (two steps).

As the first condition, a condition similar to the first condition of Sample 1 was used.

As the second condition, a plasma CVD method was used in which plasma discharge was performed in the following conditions: silane, hydrogen, and argon were introduced as source gases at the flow rates of 1.8 sccm, 750 sccm, and 750 sccm, respectively, and the flow rates were stabilized; the pressure of a process chamber was set to 5000 Pa; the RF power source frequency was 13.56 MHz; the power of an RF power source was 125 W; the temperature of the upper electrode was 250° C.; and the temperature of the lower electrode was 290° C.

Figure 14A:
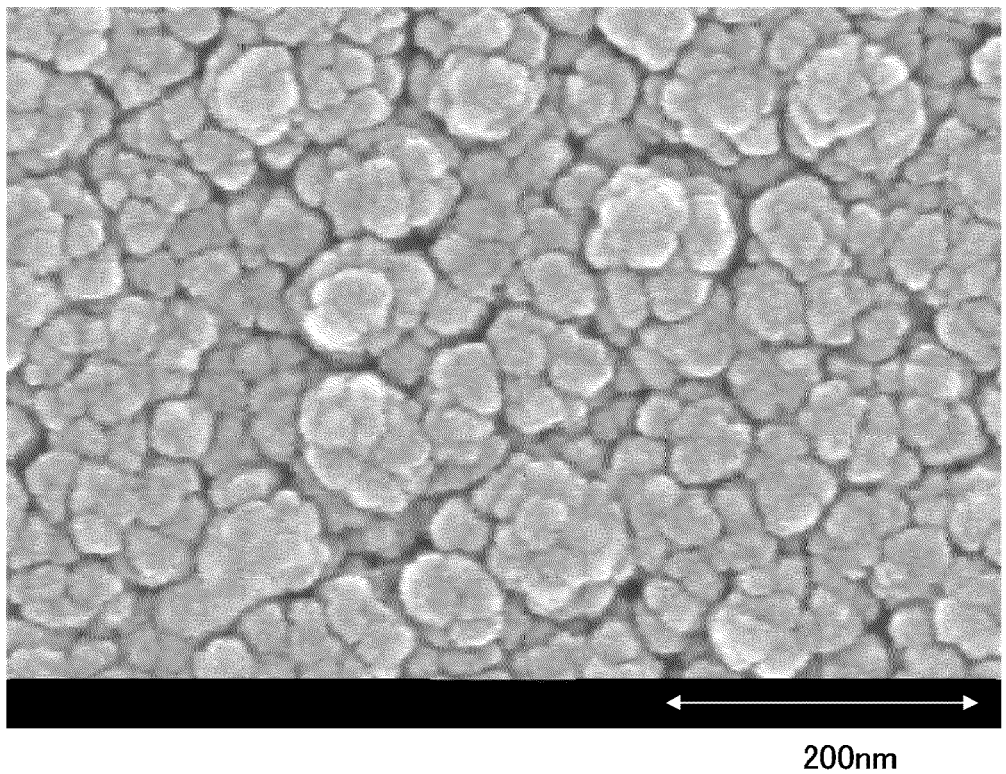
FIGS. 14A and 14B are SEM photographs of microcrystalline semiconductor films.
Figure 14B:
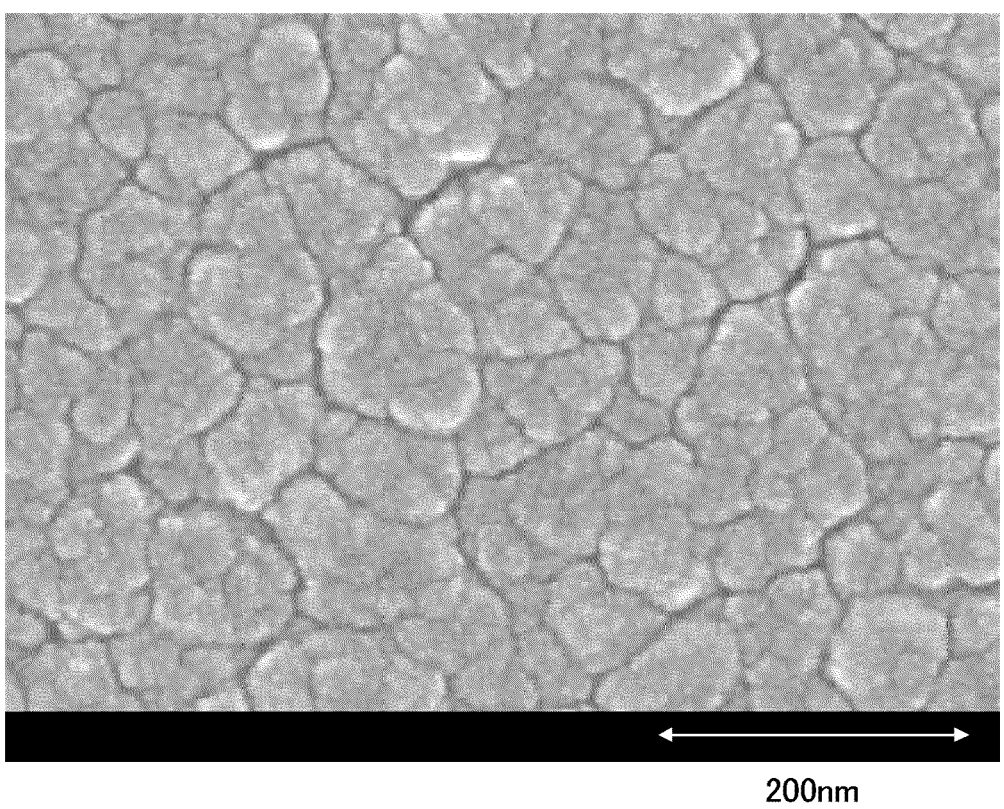

Next, each of the microcrystalline silicon films of Sample 1 which is the comparative example and Sample 2 which is the embodiment example is taken by a scanning electron microscope, and FIGS. 14A and 14B are SEM photographs (with two million-fold magnification) thereof. FIG. 14A is a SEM photograph of Sample 1 and FIG. 14B is a SEM photograph of Sample 2.

It is found that, as shown in FIG. 14A, in the microcrystalline silicon film (comparative example) formed by the one step, the surface thereof is rough and the space is formed between the mixed phase grains. In contrast, it is found that, as shown in FIG. 14B, in the microcrystalline silicon film (embodiment example) formed by the two steps in which the first microcrystalline silicon film was formed with the pressure of 532 Pa and the second microcrystalline silicon film was formed with the pressure of 5000 Pa, as the surface thereof is less rough and mixed phase grains which are in closer contact are formed compared with the microcrystalline silicon film as shown in FIG. 14A.

Figure 15A:
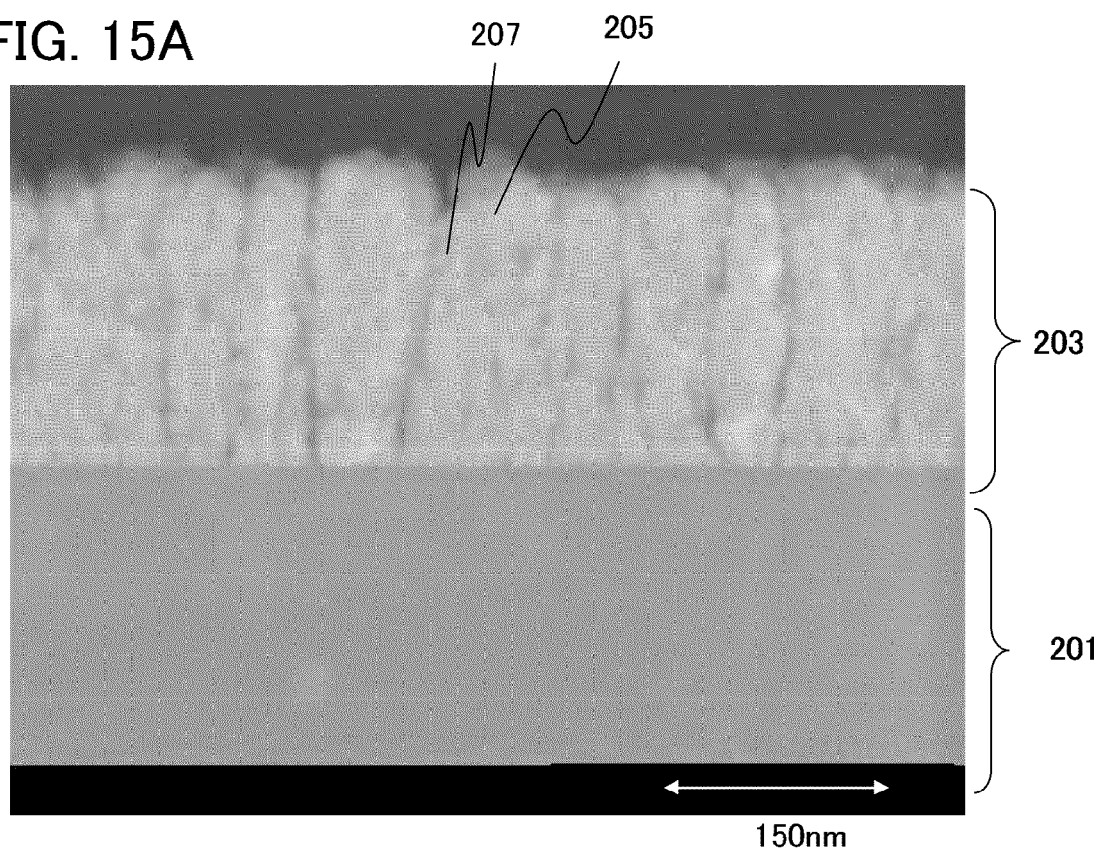
FIGS. 15A and 15B are STEM photographs of microcrystalline semiconductor films.
Figure 15B:
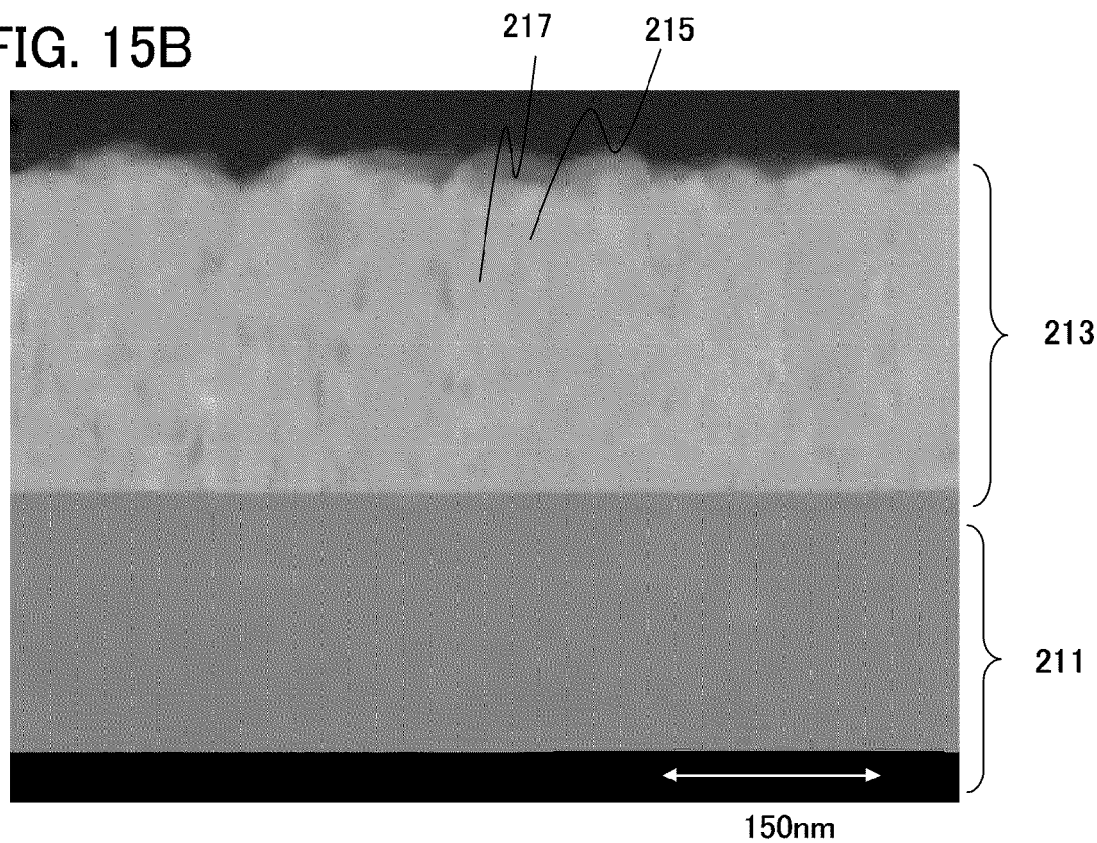

Next, FIGS. 15A and 15B show cross sections of the microcrystalline silicon films of Sample 1 which is the comparative example and Sample 2 which is the embodiment example that were taken by a scanning transmission electron microscope (STEM), respectively. FIG. 15A is a Z contrast image (ZC image) of Sample 1 and FIG. 15B is a Z contrast image (ZC image) of Sample 2.

It is found that, as shown in FIG. 15A, in the microcrystalline silicon film 203 (comparative example) formed by the one step over a quartz substrate 201, a space 207 was formed between different mixed phase grains 205. In contrast, it is found that, as shown in FIG. 15B, in the microcrystalline silicon film 213 (embodiment example) formed by the two steps over a quartz substrate 211, in which the first microcrystalline silicon film was formed with the pressure of 532 Pa and the second microcrystalline silicon film was formed with the pressure of 5000 Pa, the proportion of the space 217 formed between different mixed phase grains 215 is lower as compared with the microcrystalline silicon film as shown in FIG. 15A.

EXAMPLE 2

In this example, in the samples of Example 1, a silicon oxynitride film was formed between the substrate and the microcrystalline silicon film, and observation was performed in a similar manner to Example 1. Specific description thereof is given below.

In each of Sample 3 and Sample 4, a silicon oxynitride film was formed over a glass substrate.

As the deposition condition of the silicon oxynitride film, a plasma CVD method was used in which plasma discharge was performed in the following conditions: silane and dinitrogen monoxide were introduced as source gases at the flow rates of 5 sccm and 600 sccm, respectively, and the flow rates were stabilized; the pressure of a process chamber was set to 5000 Pa; the RF power source frequency was 13.56 MHz; the power of an RF power source was 125 W; the temperature of the upper electrode was 250° C.; and the temperature of the lower electrode was 290° C.

Next, the microcrystalline silicon film having a thickness of 100 nm, which is Sample 3 of a comparative example, was formed under a condition similar to that of Sample 1 described in Example 1 (one step).

Further, Sample 4 which is an embodiment example was formed as follows: a first microcrystalline silicon film having a thickness of 5 nm was formed under the first condition used in Sample 2 as described in Example 1, and then, a second microcrystalline silicon film having a thickness of 95 nm was formed under the second condition used in Sample 2 as described in Example 1 thereover (two steps).

Figure 16A:
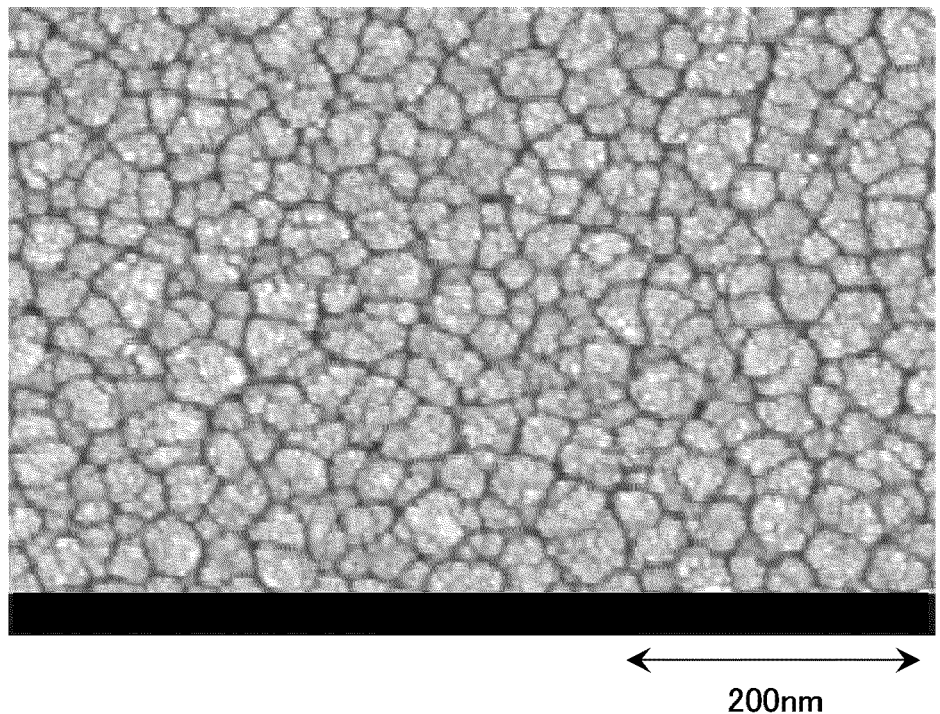
FIGS. 16A and 16B are SEM photographs of microcrystalline semiconductor films.
Figure 16B:
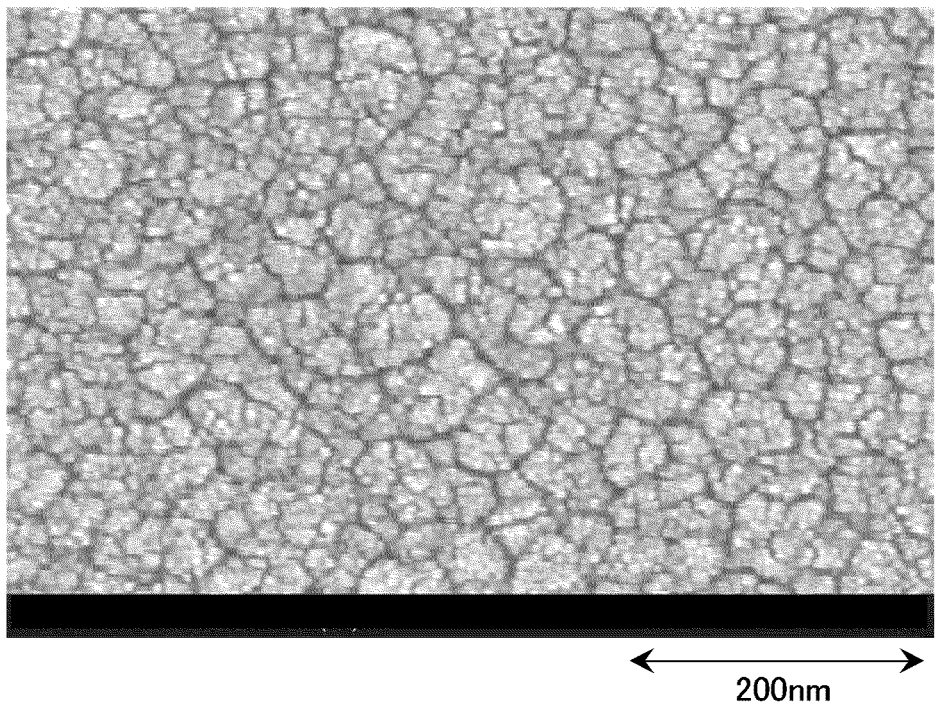

Next, each of the microcrystalline silicon films of Sample 3 which is the comparative example and Sample 4 which is the embodiment example was taken by a scanning electron microscope, and FIGS. 16A and 16B are SEM photographs (with two million-fold magnification) thereof. FIG. 16A is a SEM photograph of Sample 3 and FIG. 16B is a SEM photograph of Sample 4.

It is found that, as shown in FIG. 16A, in the microcrystalline silicon film (comparative example) formed by the one step, the surface thereof is rough and the space is formed between mixed phase grains. In contrast, it is found that, as shown in FIG. 16A, in the microcrystalline silicon film (embodiment example) formed by the two steps, the surface thereof is less rough compared with the microcrystalline silicon film and mixed phase grains which are in closer contact are formed.

Figure 17A:
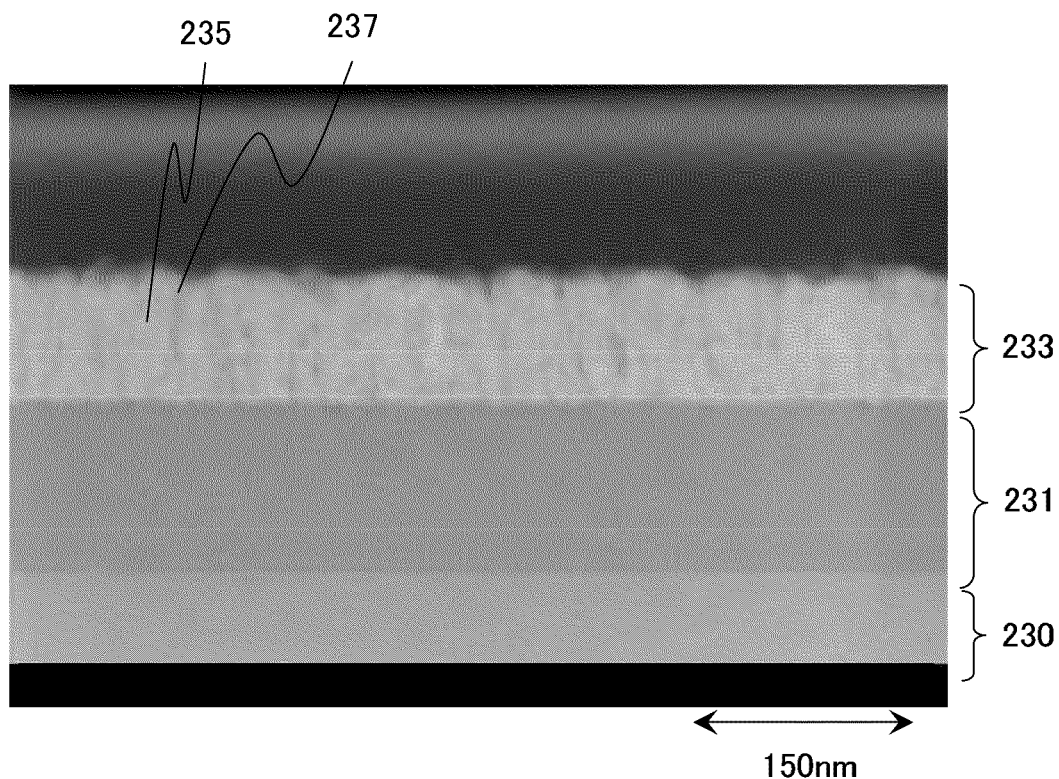
FIGS. 17A and 17B are STEM photographs of microcrystalline semiconductor films.
Figure 17B:
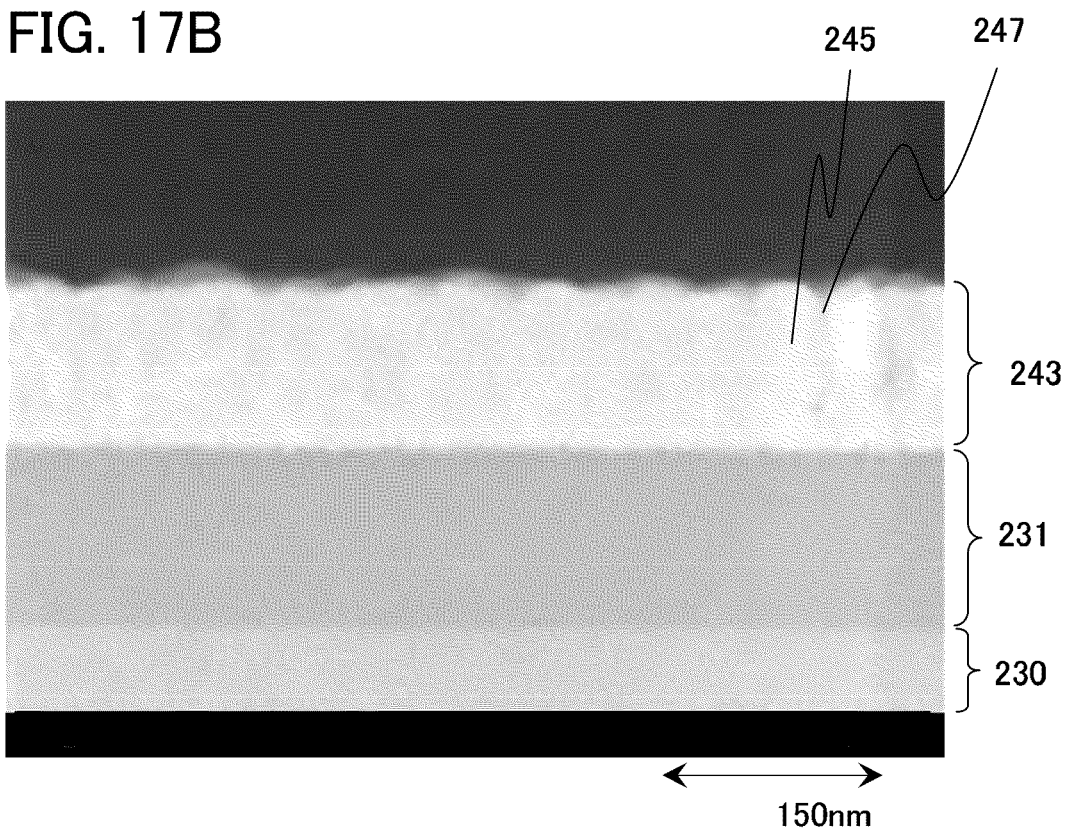

FIGS. 17A and 17B show cross sections of the microcrystalline silicon films of Sample 3 which is the comparative example and Sample 4 which is the embodiment example were taken by a scanning transmission electron microscope (STEM), respectively. FIG. 17A is a Z contrast image (ZC image) of Sample 3 and FIG. 17B is a Z contrast image (ZC image) of Sample 4. In each of FIGS. 17A and 17B, a silicon oxynitride film 231 is formed over a glass substrate 230.

It is found that, as shown in FIG. 17A, in the microcrystalline silicon film 233 (comparative example) formed by the one step over the silicon oxynitride film 231, a space 237 was formed between the different mixed phase grains 235, similarly to Example 1. In contrast, it is found that, as shown in FIG. 17B, in the microcrystalline silicon film 243 (embodiment example) formed by the two steps over the silicon oxynitride film 231, the proportion of the space 247 formed between different mixed phase grains 245 is lower compared with the microcrystalline silicon film as shown in FIG. 17A, similarly to Example 1.

Thus, similarly to Example 1, it was confirmed that, in the microcrystalline silicon film which was formed under the second condition over the silicon oxynitride film after the first condition as described in Embodiment 1, the surface thereof was not rough, and the mixed phase grains which are in close contact were formed.

This application is based on Japanese Patent Application serial no. 2010-112281 filed with Japan Patent Office on May 14, 2010, the entire contents of which are hereby incorporated by reference.

What is claimed is:

1. A method for manufacturing a microcrystalline silicon film, comprising the steps of:
    forming a first microcrystalline silicon film over an oxide insulating film by a plasma CVD method in the presence of a deposition gas containing silicon and a diluting gas containing hydrogen under a first condition; and
    forming a second microcrystalline silicon film over the first microcrystalline silicon film by a plasma CVD method in the presence of the deposition gas and the diluting gas under a second condition,
    wherein a flow ratio of the diluting gas to the deposition gas in the second condition is larger than that in the first condition, and
    wherein a pressure inside a process chamber in the second condition is larger than that in the first condition.

2. The method according to claim 1,
    wherein, under the first condition, a flow rate of the diluting gas is greater than or equal to 50 times and less than or equal to 1000 times that of the deposition gas, and the pressure inside the process chamber is higher than or equal to 67 Pa and lower than or equal to 1333 Pa.

3. The method according to claim 1,
    wherein, under the second condition, a flow rate of the diluting gas is greater than or equal to 100 times and less than or equal to 2000 times that of the deposition gas, and the pressure inside the process chamber is higher than or equal to 1333 Pa and lower than or equal to 13332 Pa.

4. The method according to claim 1, further comprising:
    a step of forming a third microcrystalline silicon film over the second microcrystalline silicon film by a plasma CVD method under a third condition,
    wherein, under the third condition, the flow ratio of the diluting gas to the deposition gas is greater than that of the second condition, and the pressure inside the process chamber is higher than or equal to 1333 Pa and lower than or equal to 13332 Pa.

5. The method according to claim 1,
    wherein, under the first condition, a mixed phase grain is formed at a particle density more than or equal to 100/$\mu m^2$ and less than or equal to 10000/$\mu m^2$, and
    wherein the mixed phase grain comprises a silicon crystallite and amorphous silicon.

6. The method according to claim 1,
    wherein the second condition allows the second microcrystalline silicon film to have a density higher than 1.90 g/cm$^3$ and lower than or equal to 2.30 g/cm$^3$.

7. The method according to claim 1,
    wherein a rare gas is contained in at least one of the deposition gas and the diluting gas.

8. The method according to claim 1,
    wherein the oxide insulating film comprises at least one of silicon oxide, silicon oxynitride, aluminum oxide, and aluminum nitride oxide.

9. A manufacturing method of a semiconductor device comprising the steps of:
    forming a gate electrode;
    forming an oxide insulating film over the gate electrode;
    forming a first microcrystalline silicon film over the oxide insulating film by a plasma CVD method in the presence of a deposition gas containing silicon and a diluting gas containing hydrogen under a first condition; and
    forming a second microcrystalline silicon film over the first microcrystalline silicon film by a plasma CVD method in the presence of the deposition gas and the diluting gas under a second condition,
    wherein a flow ratio of the diluting gas to the deposition gas in the second condition is larger than that in the first condition, and
    wherein a pressure inside a process chamber in the second condition is larger than that in the first condition.

10. The method according to claim 9,
    wherein, under the first condition, a flow rate of the diluting gas is greater than or equal to 50 times and less than or equal to 1000 times that of the deposition gas, and the pressure inside the process chamber is higher than or equal to 67 Pa and lower than or equal to 1333 Pa.

11. The method according to claim 9,
    wherein, under the second condition, a flow rate of the diluting gas is greater than or equal to 100 times and less than or equal to 2000 times that of the deposition gas, and the pressure inside the process chamber is higher than or equal to 1333 Pa and lower than or equal to 13332 Pa.

12. The method according to claim 9, further comprising:
    a step of forming a third microcrystalline silicon film over the second microcrystalline silicon film by a plasma CVD method under a third condition,
    wherein, under the third condition, the flow ratio of the diluting gas to the deposition gas is greater than that of the second condition, and the pressure inside the process chamber is higher than or equal to 1333 Pa and lower than or equal to 13332 Pa.

13. The method according to claim 9,
    wherein, under the first condition, a mixed phase grain is formed at a particle density more than or equal to 100/$\mu m^2$ and less than or equal to 10000/$\mu m^2$, and
    wherein the mixed phase grain comprises a silicon crystallite and amorphous silicon.

14. The method according to claim 9,
    wherein the second condition allows the second microcrystalline silicon film to have a density higher than 1.90 g/cm$^3$ and lower than or equal to 2.30 g/cm$^3$.

15. The method according to claim 9,
    wherein a rare gas is contained in at least one of the deposition gas and the diluting gas.

16. The method according to claim 9,
    wherein the oxide insulating film comprises at least one of silicon oxide, silicon oxynitride, aluminum oxide, and aluminum nitride oxide.

17. The method according to claim 9, further comprising a step of:
    forming a third silicon film over the second microcrystalline silicon film,
    wherein the third silicon film comprises a microcrystalline region and an amorphous region over the microcrystalline region.

18. The method according to claim 17, further comprising a step of:
    forming an impurity silicon film over the third silicon film.

19. The method according to claim 18, further comprising a step of:
    oxidizing a surface of the first microcrystalline silicon film, a surface of the second microcrystalline silicon film, a surface of the third silicon film, and a surface of the impurity silicon film.

20. A semiconductor device comprising a thin film transistor, the thin film transistor comprising:
- a gate electrode;
- an oxide insulating film over the gate electrode; and
- a microcrystalline silicon film over the oxide insulating film,
- wherein the microcrystalline silicon film comprises a mixed phase grain including a silicon crystallite and amorphous silicon,
- wherein the mixed phase grain has a grain size greater than or equal to 2 nm and less than or equal to 200 nm.

21. The semiconductor device according to claim 20,
wherein the oxide insulating film comprises at least one of silicon oxide, silicon oxynitride, aluminum oxide, and aluminum nitride oxide.

22. The semiconductor device according to claim 20,
wherein the microcrystalline silicon film has a density greater than 1.90 g/cm$^3$ and less than or equal to 2.30 g/cm$^3$.

23. The semiconductor device according to claim 20,
wherein the microcrystalline silicon film has a resistivity higher than or equal to $1.0 \times 10^5$ Ω·cm and lower than or equal to $1.0 \times 10^8$ Ω·cm.

24. The semiconductor device according to claim 20,
wherein the microcrystalline silicon film has an activation energy of conductivity of 0.5 eV to 0.6 eV.

25. A method for manufacturing a microcrystalline semiconductor film, comprising the steps of:
- forming a first microcrystalline semiconductor film over an oxide insulating film under a first condition that a density of mixed phase grains is decreased and a crystallinity of the mixed phase grains is improved; and
- forming a second microcrystalline semiconductor film over the first microcrystalline semiconductor film under a second condition that a space between the mixed phase grains of the first microcrystalline semiconductor film is filled and crystal growth is promoted.

* * * * *